(12) United States Patent
Goto et al.

(10) Patent No.: US 8,385,876 B2
(45) Date of Patent: *Feb. 26, 2013

(54) SEMICONDUCTOR DEVICE

(75) Inventors: Satoshi Goto, Tokyo (JP); Tomoyuki Miyake, Tokyo (JP); Masao Kondo, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/562,380

(22) Filed: Jul. 31, 2012

(65) Prior Publication Data

US 2012/0292703 A1    Nov. 22, 2012

Related U.S. Application Data

(63) Continuation of application No. 12/695,192, filed on Jan. 28, 2010, now Pat. No. 8,244,199.

(30) Foreign Application Priority Data

Jan. 29, 2009   (JP) .................................. 2009-017997

(51) Int. Cl.
*H04B 1/28* (2006.01)
(52) U.S. Cl. ......... 455/333; 455/26.1; 455/78; 455/425; 455/550.1; 455/556.1; 455/560; 257/280; 257/281; 257/341; 257/472

(58) Field of Classification Search ................. 455/26.1, 455/333, 78, 425, 550.1, 556.1, 560; 257/280, 257/281, 341, 472
See application file for complete search history.

(56) References Cited

U.S. PATENT DOCUMENTS

| | | | | | |
|---|---|---|---|---|---|
| 5,548,239 | A | * | 8/1996 | Kohama | 327/408 |
| 5,777,530 | A | * | 7/1998 | Nakatuka | 333/104 |
| 5,801,577 | A | * | 9/1998 | Tailliet | 327/536 |
| 5,945,867 | A | * | 8/1999 | Uda et al. | 327/431 |
| 6,066,993 | A | * | 5/2000 | Yamamoto et al. | 333/103 |
| 6,804,502 | B2 | * | 10/2004 | Burgener et al. | 455/333 |
| 7,123,898 | B2 | * | 10/2006 | Burgener et al. | 455/333 |
| 8,093,940 | B2 | * | 1/2012 | Huang et al. | 327/430 |
| 2005/0017789 | A1 | * | 1/2005 | Burgener et al. | 327/436 |

\* cited by examiner

*Primary Examiner* — April G Gonzales
(74) *Attorney, Agent, or Firm* — Miles and Stockbridge P.C.

(57) ABSTRACT

In view of achieving a cost reduction of an antenna switch, a technique is provided which can reduce harmonic distortion generated in the antenna switch as much as possible in particular even when the antenna switch is comprised of a field effect transistor formed over a silicon substrate. Each of a TX series transistor, an RX series transistor, and an RX shunt transistor is comprised of a low voltage MISFET, while a TX shunt transistor is comprised of a high voltage MISFET. Thus, by reducing the number of serial connections of the high voltage MISFETs constituting the TX shunt transistor, the nonuniformity of the voltage amplitudes applied to the respective serially-coupled high voltage MISFETs is suppressed. As a result, the generation of high-order harmonics can be suppressed.

20 Claims, 19 Drawing Sheets

SEMICONDUCTOR DEVICE

CROSS-REFERENCE TO RELATED APPLICATION

This application is a continuation of application Ser. No. 12/695,192 filed Jan. 28, 2010 now U.S. Pat. No. 8,244,199. Also, the disclosure of Japanese Patent Application No. 2009-17997 filed on Jan. 29, 2009 including the specification, drawings and abstract is incorporated herein by reference in its entirety.

BACKGROUND OF THE INVENTION

The present invention relates to semiconductor devices, and in particular relates to a technique effectively applied to an antenna switch mounted on radio communication equipment, for example.

US patent No. 2005/0017789 (Patent Document 1) describes a technique related to an RF (Radio Frequency) switching circuit. In this technique, the RF switching circuit is manufactured using an SOI technique, and includes a switching transistor and a shunt transistor. Each of the switching transistor and the shunt transistor is composed of a plurality of MOSFETs (Metal Oxide Semiconductor Field Effect Transistors) coupled in series. Then, Patent Document 1 discloses a structure wherein the number of MOSFETs coupled in series in the switching transistor is the same as the number of MOSFETs coupled in series in the shunt transistor.

SUMMARY OF THE INVENTION

In recent portable telephones, not only a voice call function but various application functions are added. Namely, the functions of watching and listening to a distributed music, video transmission, data transfer, and the like using a portable telephone, other than the voice call function, are added to the portable telephone. As such multi-function of a portable telephone has progressed, there are a number of frequency bands (GSM (Global System for Mobile communications) band, PCS (Personal Communication Services) band, and the like) and a number of modulation schemes (GSM, EDGE (Enhanced Data rates for GSM Evolution), WCDMA (Wideband Code Division Multiplex Access), and the like) around the world. Accordingly, a portable telephone needs to handle transmission/reception signals accommodating a plurality of different frequency bands and different modulation schemes. For this reason, in a portable telephone, one antenna is shared between transmission and reception of these transmission/reception signals, and the switching of connection to the antenna is performed using an antenna switch.

For example, in a portable telephone, the power of a transmission signal is usually high and exceeds 1 W, for example, and the antenna switch is therefore required to have performance to secure high quality in high-power transmission signals and also reduce the generation of interfering waves (high order harmonics) adversely affecting the communications in other frequency band. For this reason, when a field effect transistor is used as the switching element constituting the antenna switch, this field effect transistor is required to have not only high-voltage resistance but performance that can reduce the high-order harmonic distortion.

For this reason, for the field effect transistor constituting the antenna switch, a field effect transistor (e.g., HEMT (High Electron Mobility Transistor)) formed over a GaAs substrate or sapphire substrate having a small parasitic capacitance and being excellent in linearity is used in order to achieve low loss and low harmonic distortion. However, a compound semiconductor substrate excellent in high frequency characteristics is expensive, and is not preferable in view of reducing the cost of the antenna switch. In order to achieve a cost reduction of the antenna switch, it is effective to use a field effect transistor formed over an inexpensive silicon substrate. However, the inexpensive silicon substrate has problems in that the parasitic capacitance is large as compared with the expensive compound semiconductor substrate and that the harmonic distortion is larger than that of the field effect transistor formed over the compound semiconductor substrate.

The present invention has been made in view of the above circumstances and provides a technique that can reduce the harmonic distortion generated in an antenna switch as much as possible in particular even when the antenna switch is composed of field effect transistors formed over a silicon substrate, in view of achieving a cost reduction of the antenna switch.

The above and other objects and novel features of the present invention will become clear from the following detailed description in this specification and the accompanying drawings.

The following explains briefly the outline of a typical invention among the inventions disclosed in the present application.

A semiconductor device according to the preferred embodiment comprises an antenna switch having a transmission terminal, an antenna terminal, and a reception terminal. Here, the antenna switch includes: (a) a plurality of first MISFETs coupled in series between the transmission terminal and the antenna terminal; (b) a plurality of second MISFETs coupled in series between the reception terminal and the antenna terminal; (c) a plurality of third MISFETs coupled in series between the transmission terminal and a GND terminal; and (d) a fourth MISFET coupled between the reception terminal and the GND terminal. Then, each of the first MISFET, the second MISFET, and the fourth MISFET is comprised of a low voltage MISFET, while the third MISFET is comprised of a high voltage MISFET whose breakdown voltage between a source region and a drain region is higher than that of the low voltage MISFET. Furthermore, here, the number of the third MISFETs coupled in series between the transmission terminal and the GND terminal is fewer than that of the second MISFETs coupled in series between the reception terminal and the antenna terminal.

The following explains briefly the effect acquired by the typical invention among the inventions disclosed in the present application.

In particular, even when an antenna switch is comprised of a field effect transistor formed over a silicon substrate, the harmonic distortion generated in the antenna switch can be reduced as much as possible.

DETAILED DESCRIPTION OF THE PREFERRED EMBODIMENTS

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc.

Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

In all the drawings for explaining embodiments, the same symbol is attached to the same member, as a principle, and the repeated explanation thereof is omitted. In order to make a drawing intelligible, hatching may be attached even if it is a plan view.

First Embodiment

<Configuration and Operation of Portable Telephone>

Figure 1:
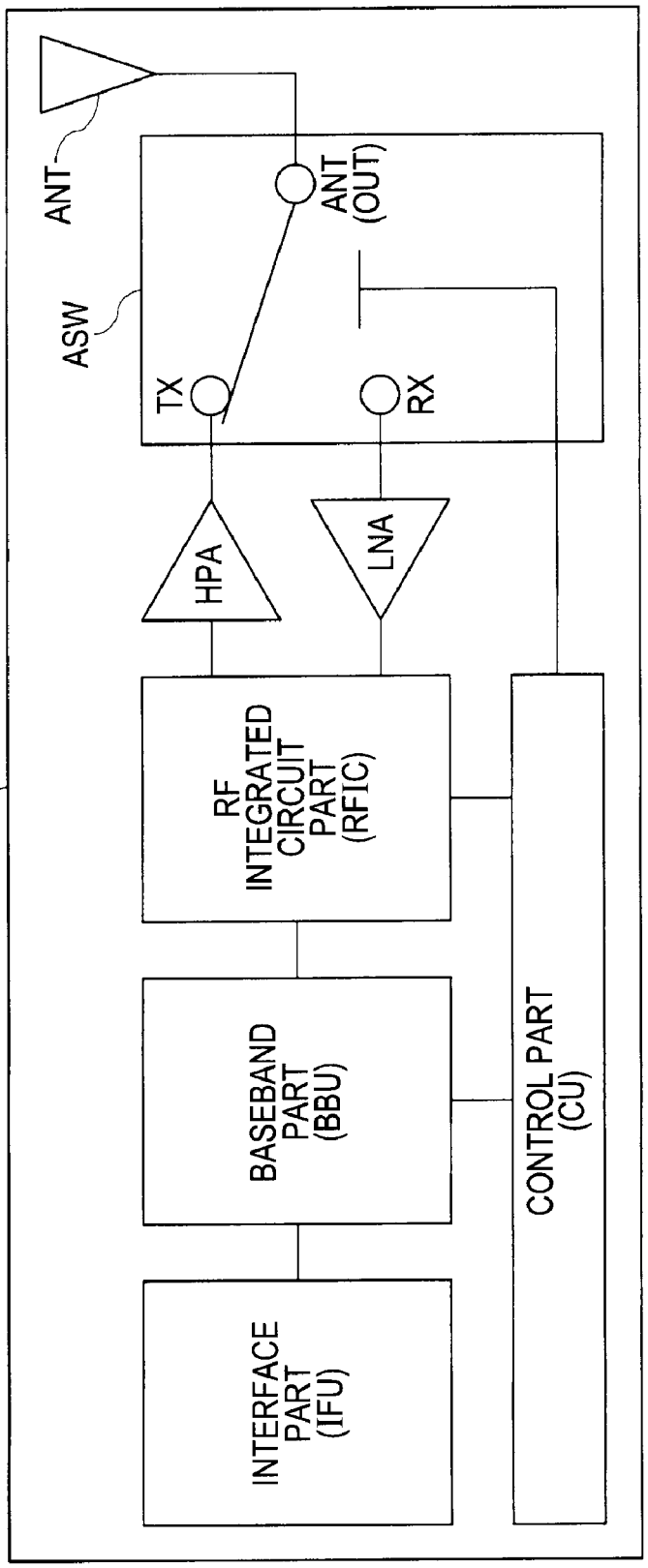
FIG. 1 is a block diagram showing a configuration of a portable telephone in a first embodiment according to the present invention.

FIG. 1 is a block diagram showing a configuration of a transmission/reception part of a portable telephone. As shown in FIG. 1, a portable telephone 1 includes an interface part IFU, a baseband part BBU, an RF integrated circuit part RFIC, a power amplifier HPA, a low noise amplifier LNA, an antenna switch ASW, and an antenna ANT.

The interface part IFU has the function to process an audio signal from a user (caller). In other words, the interface part IFU has the function to interface between a user and the portable telephone. Then, the baseband part BBU contains a CPU, which is a central control part, so that at the time of transmission a baseband signal can be generated by performing digital processing on an audio signal (analog signal) from a user (caller) via an operation part, while at the time of reception an audio signal can be generated from the baseband signal which is a digital signal. Furthermore, the control part CU is coupled to the baseband part BBU and has the function to control the signal processing of the baseband signal in the baseband part BBU.

The RF integrated circuit part RFIC is configured to modulate a baseband signal and generate a radio frequency signal at the time of transmission while at the time of reception, it is configured to demodulate a reception signal and generate a baseband signal. At this time, the control part CU is also coupled to the RF integrated circuit part RFIC, and also has the function to control the modulation of a transmission signal and the demodulation of a reception signal in the RF integrated circuit part RFIC.

The power amplifier HPA is a circuit that newly generates a high power signal analogous to a weak input signal using a power supplied from a power supply and outputs the generated signal. On the other hand, the low noise amplifier LNA is configured to amplify a reception signal without amplifying a noise contained in the reception signal.

The antenna switch ASW is used for separating a reception signal input to the portable telephone 1 from a transmission signal output from the portable telephone 1, and the antenna ANT is used for transmitting and receiving radio waves. The antenna switch ASW has a transmission terminal TX, a reception terminal RX, and an antenna terminal ANT (OUT), for example. The transmission terminal TX is coupled to the power amplifier HPA, and the reception terminal RX is coupled to the low noise amplifier LNA. Furthermore, the antenna terminal ANT (OUT) is electrically coupled to the antenna ANT. The antenna switch ASW is coupled to the control part CU, and the switching operation of a switch in the antenna switch ASW is controlled by the control part CU.

The portable telephone 1 is configured as described above, and now the operation thereof is described briefly. First, a case where a signal is transmitted is described. When a signal such as an audio signal is input to the baseband part BBU via the interface part IFU, the baseband part BBU will perform digital processing on an analog signal such as the audio signal. The baseband signal thus generated is input to the RF integrated circuit part RFIC. The RF integrated circuit part RFIC converts the input baseband signal to a signal of a radio frequency (RF frequency) using a modulation signal source and a mixer. The signal converted to a radio frequency is output from the RF integrated circuit part RFIC to the power amplifier (RF module) HPA. The signal of a radio frequency input to the power amplifier HPA is amplified by the power amplifier HPA and thereafter the resultant signal is transmitted from the antenna ANT via the antenna switch ASW. Specifically, in the antenna switch ASW, switching is made so as to electrically couple the transmission terminal TX, which is electrically coupled to the power amplifier HPA, to the antenna ANT. The signal of a radio frequency thus amplified by the power amplifier HPA is transmitted from the antenna ANT via the antenna switch ASW.

Next, a case where a signal is received is described. A signal (reception signal) of a radio frequency received by the antenna ANT is input to the low noise amplifier LNA via the antenna switch ASW. Specifically, in the antenna switch ASW, switching is made so as to electrically couple the antenna ANT to the reception terminal RX. The reception signal thus received by the antenna ANT is transmitted to the reception terminal RX of the antenna switch ASW. Since the reception terminal RX of the antenna switch ASW is coupled to the low noise amplifier LNA, the reception signal is input from the reception terminal RX of the antenna switch ASW to the low noise amplifier LNA. Then, the reception signal is amplified by the low noise amplifier LNA and thereafter the resultant signal is input to the RF integrated circuit part RFIC. In the RF integrated circuit part RFIC, frequency conversion is performed using the modulation signal source and the mixer. Then, detection of the frequency-converted signal is performed to extract a baseband signal. Subsequently, this baseband signal is output from the RF integrated circuit part RFIC to the baseband part BBU. This baseband signal is processed by the baseband part BBU, and an audio signal is output from the portable telephone 1 via the interface part IFU. The above is the simple configuration and operation of the portable telephone 1 for transmitting and receiving a single band signal.

Recently, in the portable telephone, not only a voice call function but various application functions are added. Namely, functions other than the voice call function, such as watching and listening to a distributed music, video transmission, and data transfer, using a portable telephone are added to the portable telephone. As such multi-function of a portable telephone has progressed, there are a number of frequency bands and a number of modulation schemes around the world. Accordingly, there are some portable telephones that handle transmission/reception signals accommodating a plurality of different frequency bands and a plurality of different modulation schemes.

Figure 2:
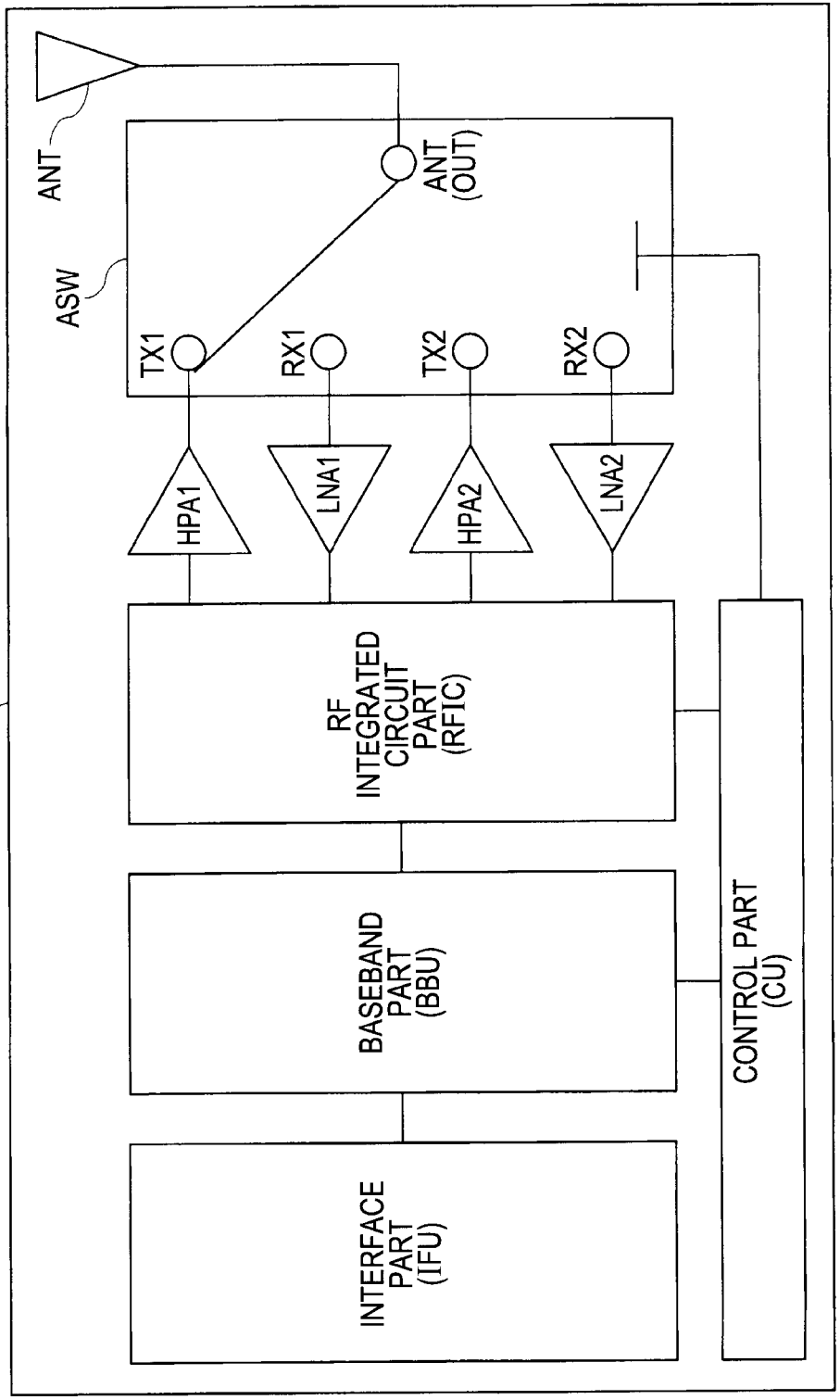
FIG. 2 is a block diagram showing a configuration of a dual-band portable telephone.

FIG. 2 is a block diagram showing a configuration of the portable telephone 1 that transmits and receives a dual-band signal, for example. The configuration of the portable telephone 1 shown in FIG. 2 is almost the same as the basic configuration of the portable telephone 1 shown in FIG. 1. A difference is that power amplifiers and low noise amplifiers are provided corresponding to signals of the respective frequency bands in order to transmit and receive the signals of a plurality of different frequency bands. For example, the signals of a plurality of different frequency bands include the signals of a first frequency band and the signals of a second frequency band. The signals of the first frequency band include signals utilizing the GSM (Global System for Mobile Communication) scheme, the signals using 824 MHz to 915 MHz in the lower frequency band of GSM as the frequency band. On the other hand, the signals of the second frequency band include the signals utilizing the GSM (Global System for Mobile Communication) scheme, the signals using 1710 MHz to 1910 MHz in the higher frequency band of GSM as the frequency band.

In the portable telephone 1 shown in FIG. 2, the interface part IFU, the baseband part BBU, the RF integrated circuit part RFIC, and the control part CU are configured so as to be able to perform signal processing of the signals of the first frequency band and the signals of the second frequency band. Then, a power amplifier HPA1 and a low noise amplifier LNA1 are provided corresponding to the signals of the first frequency band, and a power amplifier HPA2 and a low noise amplifier LNA2 are provided corresponding to the signals of the second frequency band. Namely, in the dual-band portable telephone 1 shown in FIG. 2, there are two transmission paths and two reception paths corresponding to the signals of different frequency bands.

Accordingly, there are four switching terminals in the antenna switch ASW. That is, a transmission terminal TX1 is provided corresponding to the transmission signals of the first frequency band, and a reception terminal RX1 is provided corresponding to the reception signals of the first frequency band. Further, a transmission terminal TX2 is provided corresponding to the transmission signals of the second frequency band, and a reception terminal RX2 is provided corresponding to the reception signals of the second frequency band. Thus, there are four switching terminals in the antenna switch ASW, and switching of these terminals is controlled by the control part CU. The foregoing is a simple configuration of the portable telephone 1 transmitting and receiving dual band signals, and the operation thereof is the same as that of the portable telephone 1 transmitting and receiving single band signals.

<Circuit Configuration of an Antenna Switch in a Comparative Example>

Next, a circuit configuration of the antenna switch is described. Although mainly the circuit configuration of the antenna switch ASW used in the single band portable telephone 1 shown in FIG. 1 is described in this specification, the circuit configuration of the antenna switch ASW used in the dual band portable telephone 1 shown in FIG. 2 is also almost the same.

Figure 3:
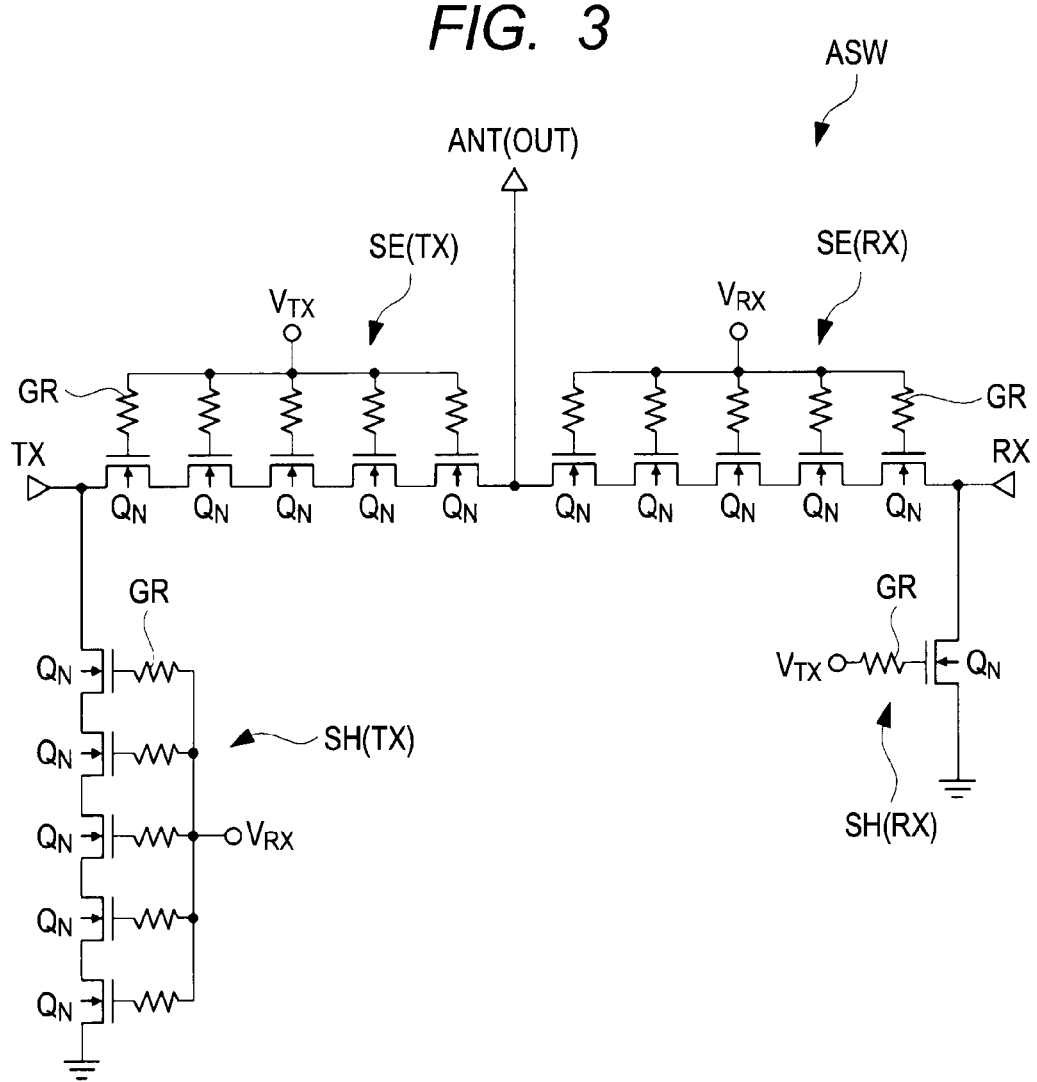
FIG. 3 shows a circuit configuration of an antenna switch in a comparative example.

FIG. 3 shows the circuit configuration of the antenna switch ASW in a comparative example studied by the present inventor. As shown in FIG. 3, the antenna switch ASW in the comparative example has the transmission terminal TX, the reception terminal RX, and the antenna terminal ANT (OUT). Further, the antenna switch ASW in the comparative example includes a TX series transistor SE (TX) between the transmission terminal TX and the antenna terminal ANT (OUT), and includes an RX series transistor SE (RX) between the reception terminal RX and the antenna terminal ANT (OUT). Furthermore, the antenna switch ASW in the comparative example includes a TX shunt transistor SH (TX) between the transmission terminal TX and a GND terminal, and includes an RX shunt transistor SH (RX) between the reception terminal RX and the GND terminal.

The TX series transistor SE (TX) provided between the transmission terminal TX and the antenna terminal ANT (OUT) is composed of five low-voltage MISFETs $Q_N$ coupled in series, for example. At this time, each MISFET $Q_N$ has a source region, a drain region, and a gate electrode. In this specification, the source region and the drain region of the low voltage MISFET $Q_N$ are in a symmetrical relation, and here in the low voltage MISFET $Q_N$ constituting the TX series transistor SE (TX), a region on the transmission terminal TX side shall be defined as the drain region, and a region on the antenna terminal ANT (OUT) side as the source region. Furthermore, the gate electrode of the low voltage MISFET $Q_N$ is coupled to a control terminal $V_{TX}$ via a gate resistance GR. The gate resistance GR is an isolation resistor for preventing high frequency signals from leaking into the control terminal $V_{TX}$. In other words, the gate resistance GR has the function to attenuate high frequency signals. In the TX series transistor SE (TX) thus configured, the on/off of the low voltage MISFETs $Q_N$ coupled in series is controlled by controlling the voltage applied to the control terminal $V_{TX}$, so that the transmission terminal TX and the antenna terminal ANT (OUT) may be electrically coupled to each other or electrically isolated from each other. That is, the TX series transistor SE (TX) functions as a switch to switch electrical connection/disconnection between the transmission terminal TX and the antenna terminal ANT (OUT). The reason why the low voltage MISFET $Q_N$ is used as the MISFET constituting the TX series transistor SE (TX) is that when the transmission terminal TX and the antenna terminal ANT (OUT) are electrically coupled to each other to transmit a transmission signal, the power loss is reduced by reducing the on-resistance of the transmission path.

Subsequently, the RX series transistor SE (RX) provided between the reception terminal RX and the antenna terminal ANT (OUT) also includes five low-voltage MISFETs $Q_N$ coupled in series, for example, as with the TX series transistor SE (TX). At this time, each low-voltage MISFET $Q_N$ has a source region, a drain region, and a gate electrode. In this specification, the source region and the drain region of the low voltage MISFET $Q_N$ are in a symmetrical relation, and here in the low voltage MISFET $Q_N$ constituting the RX series transistor SE (RX), a region on the antenna terminal ANT (OUT) side shall be defined as the drain region, and a region on the reception terminal RX side as the source region. Furthermore, the gate electrode of the low voltage MISFET $Q_N$ is coupled to a control terminal $V_{RX}$ via the gate resistance GR. The gate resistance GR is an isolation resistor for preventing high frequency signals from leaking into the control terminal $V_{RX}$. In other words, the gate resistance GR has the function to attenuate high frequency signals. In the RX series transistor SE (RX) thus configured, the on/off of the low voltage MISFETs QN coupled in series is controlled by controlling the voltage applied to the control terminal $V_{RX}$, so that the reception terminal RX and the antenna terminals ANT (OUT) may be electrically coupled to each other or electrically isolated from each other. That is, the RX series transistor SE (RX) functions as a switch to switch electrical connection/disconnection between the reception terminal RX and the antenna terminal ANT (OUT). The reason why the low voltage MISFET $Q_N$ is used as the MISFET constituting the RX series transistor SE (RX) is that when the reception terminal RX and the antenna terminal ANT (OUT) are coupled to each other and a reception signal is transmitted, the power loss is reduced by reducing the on-resistance of the reception path.

Next, the TX shunt transistor SH (TX) provided between the transmission terminal TX and the GND terminal includes five low-voltage MISFETs $Q_N$ coupled in series, for example. In this case, each low-voltage MISFET $Q_N$ has a source region, a drain region, and a gate electrode. In this specification, the source region and the drain region of the low voltage MISFET $Q_N$ are in a symmetrical relation, and here in the low voltage MISFET $Q_N$ constituting the TX shunt transistor SH (TX), a region on the transmission terminal TX side shall be defined as the drain region, and a region on the GND terminal side as the source region. Furthermore, the gate electrode of the low voltage MISFET $Q_N$ is coupled to the control terminal $V_{RX}$ via the gate resistance GR. The gate resistance GR is an isolation resistor for preventing high frequency signals from leaking into the control terminal $V_{RX}$. In other words, the gate resistance GR has the function to attenuate high frequency signals.

Here, the TX series transistor SE (TX) is a component required as the antenna switch ASW because the TX series transistor SE (TX) described above functions as the switch to switch the connection/disconnection of the transmission path for transmitting a transmission signal between the transmission terminal TX and the antenna terminal ANT (OUT). In contrast, the TX shunt transistor SH (TX) serves to switch the connection/disconnection between the transmission terminal TX and the GND terminal, and a transmission signal is not transmitted directly through the path between the transmission terminal TX and the GND terminal, so it is questionable that the TX shunt transistor SH (TX) needs to be provided. However, the TX shunt transistor SH (TX) has an important function in receiving a reception signal with the antenna.

Hereinafter, the function of the TX shunt transistor SH (TX) is described. When a reception signal is received from the antenna, in the antenna switch ASW the RX series transistor SE (RX) is turned on to electrically couple the antenna terminal ANT (OUT) to the reception terminal RX. The reception signal thus received by the antenna is transmitted from the antenna terminal ANT (OUT) to a reception circuit via the reception terminal RX. It is then necessary not to allow the reception signal to be transmitted to the transmission path side, and therefore the TX series transistor SE (TX) provided between the antenna terminal ANT (OUT) and the transmission terminal TX is turned off. Thereby, the reception signal input from the antenna to the antenna terminal ANT (OUT) will not be transmitted to the transmission terminal TX side. Since the transmission path between the antenna terminal ANT (OUT) and the transmission terminal TX is electrically isolated by turning off the TX series transistor SE (TX), the reception signal may ideally not leak into the transmission path. However, actually, the fact that the TX series transistor SE (TX) is off in the low voltage MISFET $Q_N$ constituting the TX series transistor SE (TX) can be regarded as that, electrically speaking, an off capacitance is generated between the source region and the drain region of the low voltage MISFET $Q_N$. For this reason, the reception signal that is a high frequency signal will leak to the transmission terminal TX side via this off capacitance. Since the power of a reception signal is small, it is preferable that the reception signal be efficiently transmitted from the antenna terminal ANT (OUT) to the reception terminal RX side. In other words, the leakage of the reception signal to the transmission terminal TX side via the off capacitance of the TX series transistor SE (TX) needs to be suppressed. In particular, the gate width of each of the low voltage MISFETs $Q_N$ constituting the TX series transistor SE (TX) is extended in view of reducing the on-resistance. Such an increase in the gate width of the low voltage MISFET $Q_N$ may be, in turn, an increase in the off capacitance. In this case, since the TX series transistor SE (TX) has five low voltage MISFETs $Q_N$ coupled in series, a combined capacitance of the TX series transistor SE (TX) is smaller than the off capacitance of one low voltage MISFET $Q_N$, although the off capacitance of the TX series transistor SE (TX) is nonnegligibly large. An increase in the off capacitance of the TX series transistor SE (TX) means that a reception signal that is a high frequency signal is accordingly more likely to leak to the transmission side. Therefore, just providing the TX series transistor SE (TX) between the transmission terminal TX and the antenna terminal ANT (OUT) cannot sufficiently suppress the leakage of a reception signal.

Therefore, the TX shunt transistor SH (TX) is provided between the transmission terminal TX and the GND terminal. That is, a reception signal leaks to the transmission terminal TX side even when the TX series transistor SE (TX) is in an off state, however, if the reception signal having leaked to the transmission terminal TX side can be sufficiently reflected at the transmission terminal TX, the reception signal leaking to the transmission terminal TX side can be suppressed. Namely, the TX shunt transistor SH (TX) provided between the transmission terminal TX and the GND terminal is provided for the purpose of sufficiently reflecting the reception signal at the transmission terminal TX.

Sufficient reflection of a reception signal, which is a high frequency signal, at the transmission terminal TX can be realized by grounding the transmission terminal TX to GND. In other words, if the impedance between the transmission terminal TX and the GND terminal can be set as low as possible, the reception signal can be reflected at the transmission terminal TX sufficiently. For this reason, at the time of reception, on the transmission terminal TX side, the transmission terminal TX and the GND terminal are electrically coupled to each other by turning off the TX series transistor SE (TX) and also turning on the TX shunt transistor SH (TX). Thus, even if a reception signal leaks to the transmission terminal TX side, the reception signal can be sufficiently reflected at the transmission terminal TX and therefore the reception signal leaking to the transmission terminal TX side can be suppressed.

The TX shunt transistor SH (TX) includes five low-voltage MISFETs $Q_N$, for example. Here, the reason why a plurality of low voltage MISFETs $Q_N$ is coupled in series is that at the time of transmission a high-power transmission signal flows into the transmission terminal TX and accordingly a high amplitude voltage is applied between the transmission terminal TX and the GND terminal. That is, by coupling the low voltage MISFETs $Q_N$ in series, the voltage amplitude applied to each MISFET $Q_N$ can be reduced to its breakdown voltage or lower even if a high voltage amplitude is applied between the transmission terminal TX and the GND terminal. Furthermore, the reason why the low voltage MISFET $Q_N$ is used as the TX shunt transistor SH (TX) is that its on-resistance can be reduced. That is, the transmission terminal TX and the GND terminal will be electrically coupled to each other when the TX shunt transistor SH (TX) is turned on, however, in this case, if the on-resistance of the TX shunt transistor SH (TX) is high, the impedance between the transmission terminal TX and the GND terminal will increase and consequently the reception signal leaking to the transmission terminal TX side cannot be sufficiently reflected at the transmission terminal TX.

Subsequently, the RX shunt transistor SH (RX) provided between the reception terminal RX and the GND terminal includes one low voltage MISFET $Q_N$, for example. In this case, the low voltage MISFET $Q_N$ has a source region, a drain region, and a gate electrode. In this specification, although the source region and the drain region of the low voltage MISFET $Q_N$ are in a symmetrical relation, in the low voltage MISFET $Q_N$ constituting the RX shunt transistor SH (RX) a region on the reception terminal RX side shall be defined as the drain region, and a region on the GND terminal side as the source region. Furthermore, the gate electrode of the low voltage MISFET $Q_N$ is coupled to the control terminal $V_{TX}$ via the gate resistance GR. The gate resistance GR is an isolation resistor for preventing high frequency signals from leaking into the control terminal $V_{TX}$. In other words, the gate resistance GR has the function to attenuate high frequency signals.

Here, at the time of transmission, even when the RX series transistor SE (TX) is in an off state, a transmission signal leaks to the reception terminal RX side because the RX series transistor SE (RX) has an off capacitance. However, if a transmission signal having leaked out to the reception terminal RX side can be sufficiently reflected at the reception terminal RX, the transmission signal leaking to the reception terminal RX side can be suppressed. That is, the RX shunt transistor SH (RX) provided between the reception terminal RX and the GND terminal is provided for the purpose of sufficiently reflecting a transmission signal at the reception terminal RX.

Sufficiently reflecting a transmission signal, which is a high frequency signal, at the reception terminal RX can be achieved by grounding the reception terminal RX to GND. In other words, if the impedance between the reception terminal RX and the GND terminal can be set as low as possible, the transmission signal can be reflected sufficiently at the reception terminal RX. For this reason, at the time of transmission, on the reception terminal RX side, the reception terminal RX and the GND terminal are electrically coupled to each other by turning off the RX series transistor SE (RX) and also turning on the RX shunt transistor SH (RX). Thus, even if a transmission signal leaks to the reception terminal RX side, the transmission signal leaking to the reception terminal RX side can be suppressed because the transmission signal can be sufficiently reflected at the reception terminal RX.

The RX shunt transistor SH (RX) includes one low voltage MISFET $Q_N$, for example. Here, the reason why a plurality of low voltage MISFETs $Q_N$ is not coupled in series unlike the TX shunt transistor SH (TX) is that even one low voltage MISFET $Q_N$ can sufficiently secure the breakdown voltage because only a micro-power reception signal flows into the reception terminal RX at the time of reception. Furthermore, the reason why the low voltage MISFET $Q_N$ is used as the RX shunt transistor SH (RX) is that the on-resistance can be reduced. That is, the reception terminal RX and the GND terminal will be electrically coupled to each other when the RX shunt transistor SH (RX) is turned on, however, in this case, if the on-resistance of the RX shunt transistor SH (RX) is high, the impedance between the reception terminal RX and the GND terminal will increase and consequently a transmission signal leaking to the reception terminal RX side cannot be sufficiently reflected at the reception terminal RX.

The antenna switch ASW in the comparative example is configured as described above, and now the operation thereof is described. First, the operation at the time of transmission is described. In FIG. 3, at the time of transmission, the TX series transistor SE (TX) and the RX shunt transistor SH (RX) are turned on, and also the TX shunt transistor SH (TX) and the RX series transistor SE (RX) are turned off. Thus, the transmission terminal TX and the antenna terminal ANT (OUT) are electrically coupled to each other, and also the reception terminal RX and the antenna terminal ANT (OUT) are electrically isolated from each other. As a result, a transmission signal is output from the transmission terminal TX toward the antenna terminal ANT (OUT). At this time, there is an off capacitance although the RX series transistor SE (RX) is off, so a part of the transmission signal that is a high frequency signal will leak out to the reception terminal RX side via the off capacitance of the RX series transistor SE (RX). However, since the RX shunt transistor SH (RX) is on, the reception terminal RX and the GND terminal are electrically coupled to each other and the impedance between the reception terminal RX and the GND terminal becomes low. For this reason, a transmission signal having leaked out to the reception terminal RX side is sufficiently reflected at the reception terminal RX. As a result, the transmission signal leaking out to the reception terminal RX is suppressed, and therefore the transmission signal is efficiently transmitted from the transmission terminal TX to the antenna terminal ANT (OUT). In this manner, the transmission signal is output from the antenna terminal ANT (OUT).

Next, the operation at the time of reception is described. In FIG. 3, at the time of reception, the RX series transistor SE (RX) and the TX shunt transistor SH (TX) are turned on, and also the RX shunt transistor SH (RX) and the TX series transistor SE (TX) are turned off. Thus, the reception terminal RX and the antenna terminal ANT (OUT) are electrically coupled to each other, and also the transmission terminal TX and the antenna terminal ANT (OUT) are electrically isolated from each other. As a result, a reception signal is transmitted from the antenna terminal ANT (OUT) toward the reception terminal RX. At this time, there is an off capacitance although the TX series transistor SE (TX) is off, so a part of the reception signal that is a high frequency signal will leak out to the transmission terminal TX side via the off capacitance of the TX series transistor SE (TX). However, since the TX shunt transistor SH (TX) is on, the transmission terminal TX and the GND terminal are electrically coupled to each other and the impedance between the transmission terminal TX and the GND terminal becomes low. For this reason, a reception signal having leaked out to the transmission terminal TX side is sufficiently reflected at the transmission terminal TX. As a result, the reception signal is efficiently transmitted from the antenna terminal ANT (OUT) to the reception terminal RX side because the reception signal leaking out to the transmission terminal TX is suppressed. In this manner, the reception signal is transmitted from the antenna terminal ANT. (OUT) to the reception terminal RX side.

<Problem of the Antenna Switch in the Comparative Example>

Although the antenna switch ASW in the comparative example is configured as described above, the antenna switch ASW in the comparative example causes a problem that the nonlinearity (harmonic distortion) of a transmission signal increases. The antenna switch ASW is required to have performance to secure high quality in high-power transmission signals and also reduce the generation of interfering waves (high order harmonics) adversely affecting the communications in other frequency band, however, in the antenna switch ASW in the comparative example, particularly generation of high-order harmonics is a problem. Hereinafter, the mechanism of how this problem occurs is described.

Figure 4:
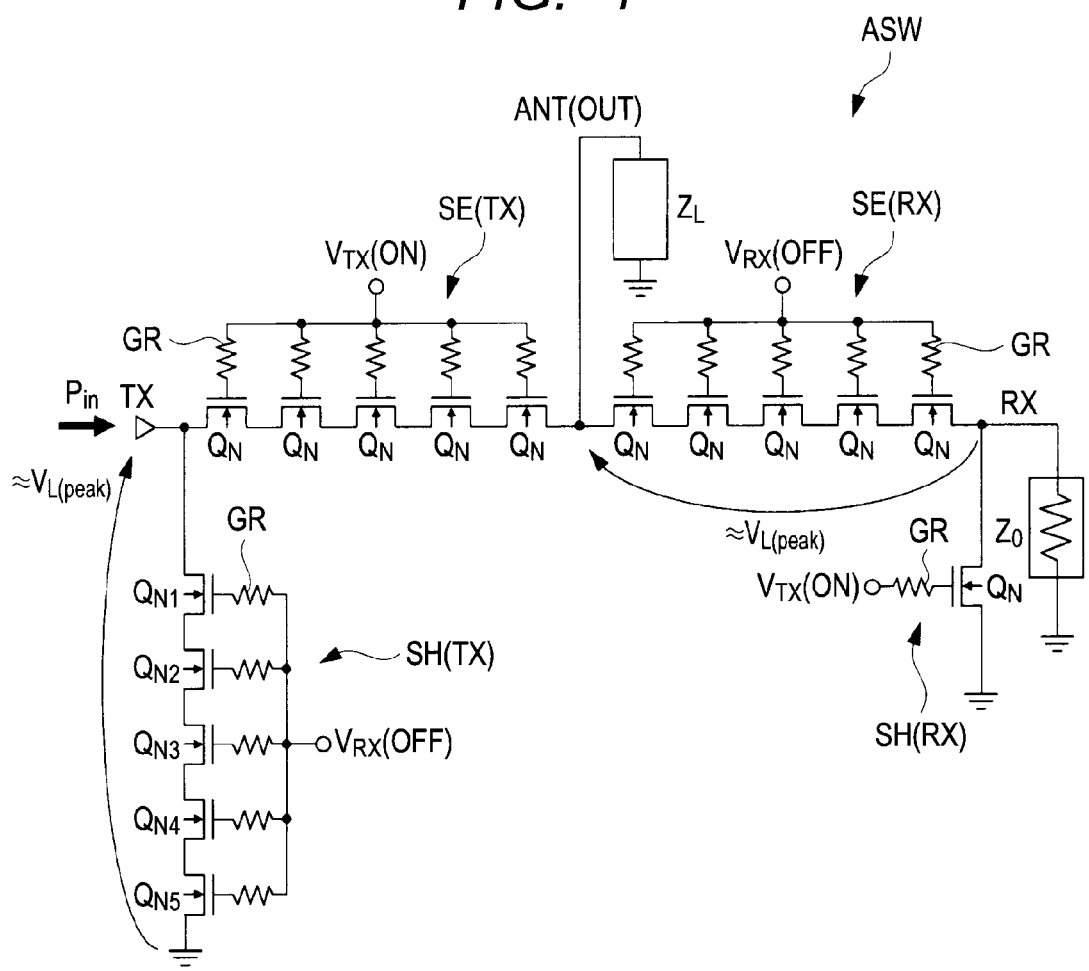
FIG. 4 illustrates a situation where an equal voltage amplitude is applied to a TX shunt transistor and an RX series transistor.

FIG. 4 is a circuit block diagram showing a state of the antenna switch ASW, which is the comparative example, at the time of transmission. In FIG. 4, a load coupled between the antenna terminal ANT (OUT) and the GND terminal of the antenna switch ASW is designated by a load $Z_L$, and a load coupled between the reception terminal RX and the GND terminal of the antenna switch ASW is designated by a load $Z_0$. Under this state, consider a case where a transmission signal having a power $P_{in}$ is input from the transmission terminal TX of the antenna switch ASW. At this time, in the antenna switch ASW, the TX series transistor SE (TX) and the RX shunt transistor SH (RX) are on, and also the TX shunt transistor SH (TX) and the RX series transistor SE (RX) are off. Therefore, the same voltage amplitude as that applied to the load $Z_L$ is applied to the TX shunt transistor SH (TX) coupled between the transmission terminal TX and the GND terminal and also to the RX series transistor SE (RX) coupled between the antenna terminal ANT (OUT) and the reception terminal RX. The maximum value of this voltage amplitude is designated by a voltage amplitude $V_{L(peak)}$.

Figure 5:
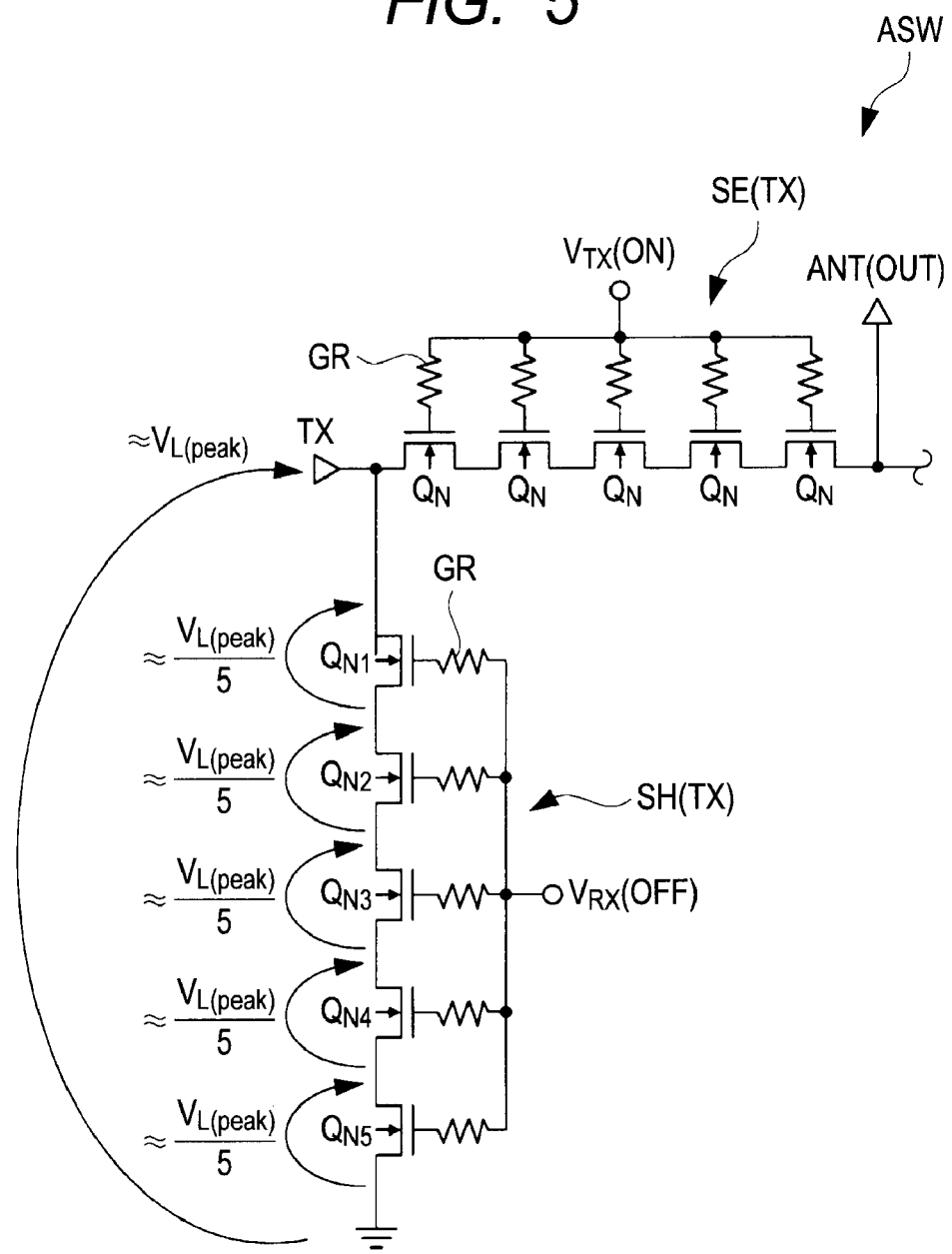
FIG. 5 shows an ideal state where a voltage amplitude is uniformly distributed to each of MISFETs constituting the TX shunt transistor.
Figure 6:
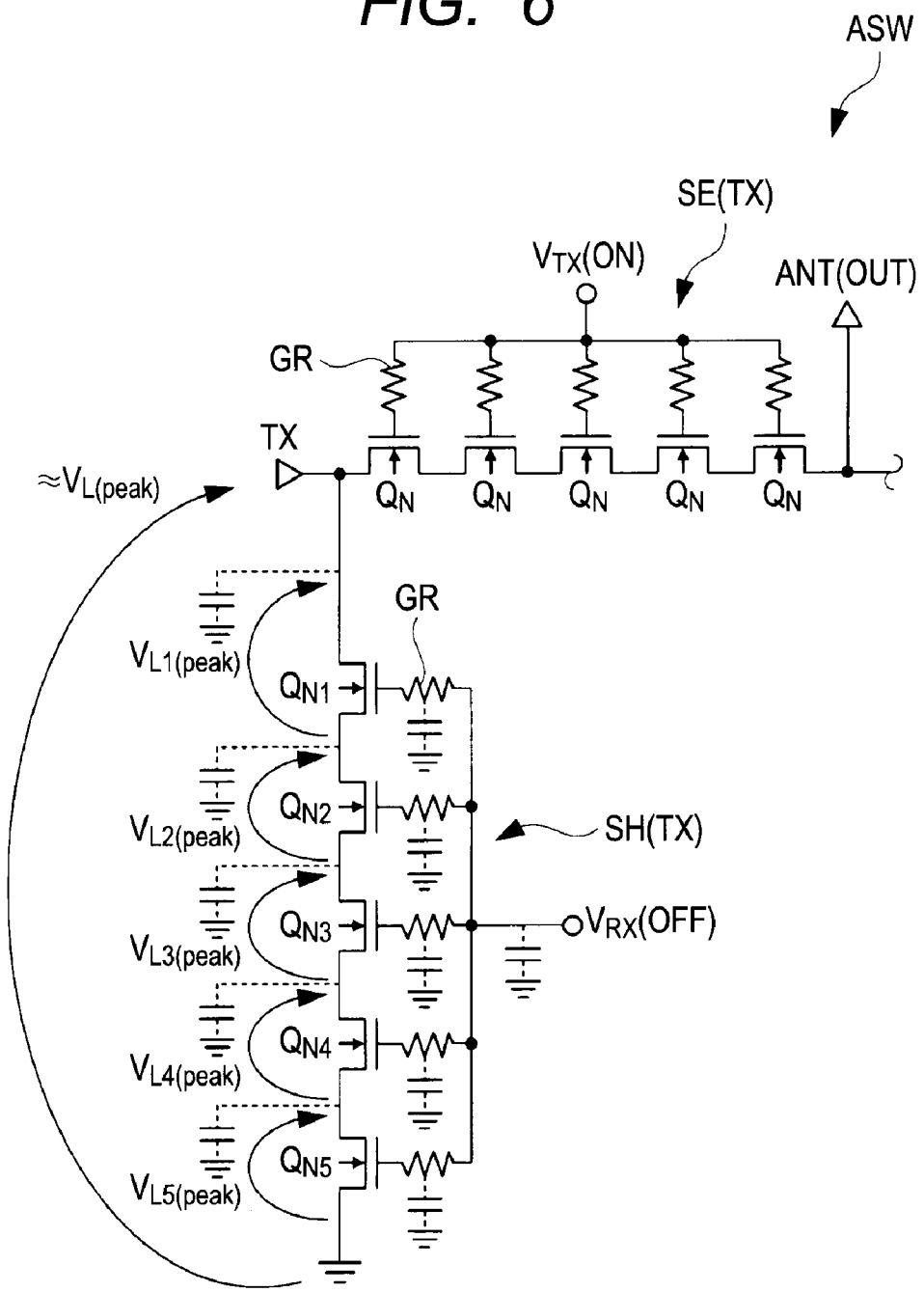
FIG. 6 shows a state where the voltage amplitude applied to each of the MISFETs constituting the TX shunt transistor becomes nonuniform.

Here, paying attention to the TX shunt transistor SH (TX), since the TX shunt transistor SH (TX) includes five low-voltage MISFETs $Q_{N1}$ to $Q_{N5}$ coupled in series between the transmission terminal TX and the GND terminal, the voltage amplitude $V_{L(peak)}$ may be equally divided and distributed to each of these low voltage MISFETs $Q_{N1}$ to $Q_{N5}$. That is, as shown in FIG. 5, a voltage amplitude $V_{L(peak)}/5$ is ideally applied to each of the five low-voltage MISFETs $Q_{N1}$ to $Q_{N5}$ constituting the TX shunt transistor SH (TX). However, actually, the equal voltage amplitude $V_{L(peak)}/5$ will not be applied to each of the five low-voltage MISFETs $Q_{N1}$ to $Q_{N5}$. Actually, as shown in FIG. 6, voltage amplitudes $V_{L1(peak)}$ to $V_{L5(peak)}$ are applied to the five low-voltage MISFETs $Q_{N1}$ to $Q_{N5}$, respectively. Namely, the voltage amplitude $V_{L1(peak)}$ is applied to the low voltage MISFET $Q_{N1}$, and the voltage amplitude $V_{L2(peak)}$ is applied to the low voltage MISFET $Q_{N2}$. Likewise, the voltage amplitude $V_{L3(peak)}$ is applied to the low voltage MISFET $Q_{N3}$, and the voltage amplitude $V_{L4(peak)}$ is applied to the low voltage MISFET $Q_{N4}$. Furthermore, the voltage amplitude $V_{L5(peak)}$ is applied to the low voltage MISFET $Q_{N5}$. In this case, the voltage amplitudes $V_{L1(peak)}$ to $V_{L5(peak)}$ satisfy the relationship: voltage amplitude $V_{L1(peak)}$>voltage amplitude $V_{L2(peak)}$>voltage amplitude $V_{L3(peak)}$>voltage amplitude $V_{L4(peak)}$>voltage amplitude $V_{L5(peak)}$. Namely, among the low voltage MISFETs $Q_{N1}$ to $Q_{N5}$, the transistor disposed at the position closer to the GND terminal will have a smaller voltage amplitude applied thereto. That is, the transistor disposed at the position closer to the transmission terminal TX will have a larger voltage amplitude applied thereto. Specifically, among the low voltage MISFETs $Q_{N1}$ to $Q_{N5}$ constituting the TX shunt transistor SH (TX), the voltage amplitude $V_{L1(peak)}$ applied to the low voltage MISFET $Q_{N1}$ is the largest.

The reason why the applied voltage amplitudes become nonuniform without being equally divided, even for the low voltage MISFETs $Q_{N1}$ to $Q_{N5}$ each having the same structure as described above, is described. The causes of the nonuniformity of the voltage amplitudes applied to the low voltage MISFETs $Q_{N1}$ to $Q_{N5}$ constituting the TX shunt transistor SH (TX) include the one as shown below, for example. That is, the presence of a parasitic capacitance to the semiconductor substrate (coupled to the GND potential) of the respective low voltage MISFETs $Q_{N1}$ to $Q_{N5}$, a parasitic capacitance to the semiconductor substrate of the gate resistance GR coupled to the gate electrode of the respective low voltage MISFETs $Q_{N1}$ to $Q_{N5}$ and a parasitic capacitance to the semiconductor substrate of wirings coupled to the respective low voltage MIS- FETs $Q_{N1}$ to $Q_{N5}$ causes this problem. The presence of these parasitic capacitances causes the nonuniform voltage amplitudes applied to the low voltage MISFETs $Q_{N1}$ to $Q_{N5}$ constituting the TX shunt transistor SH (TX).

Figure 7:
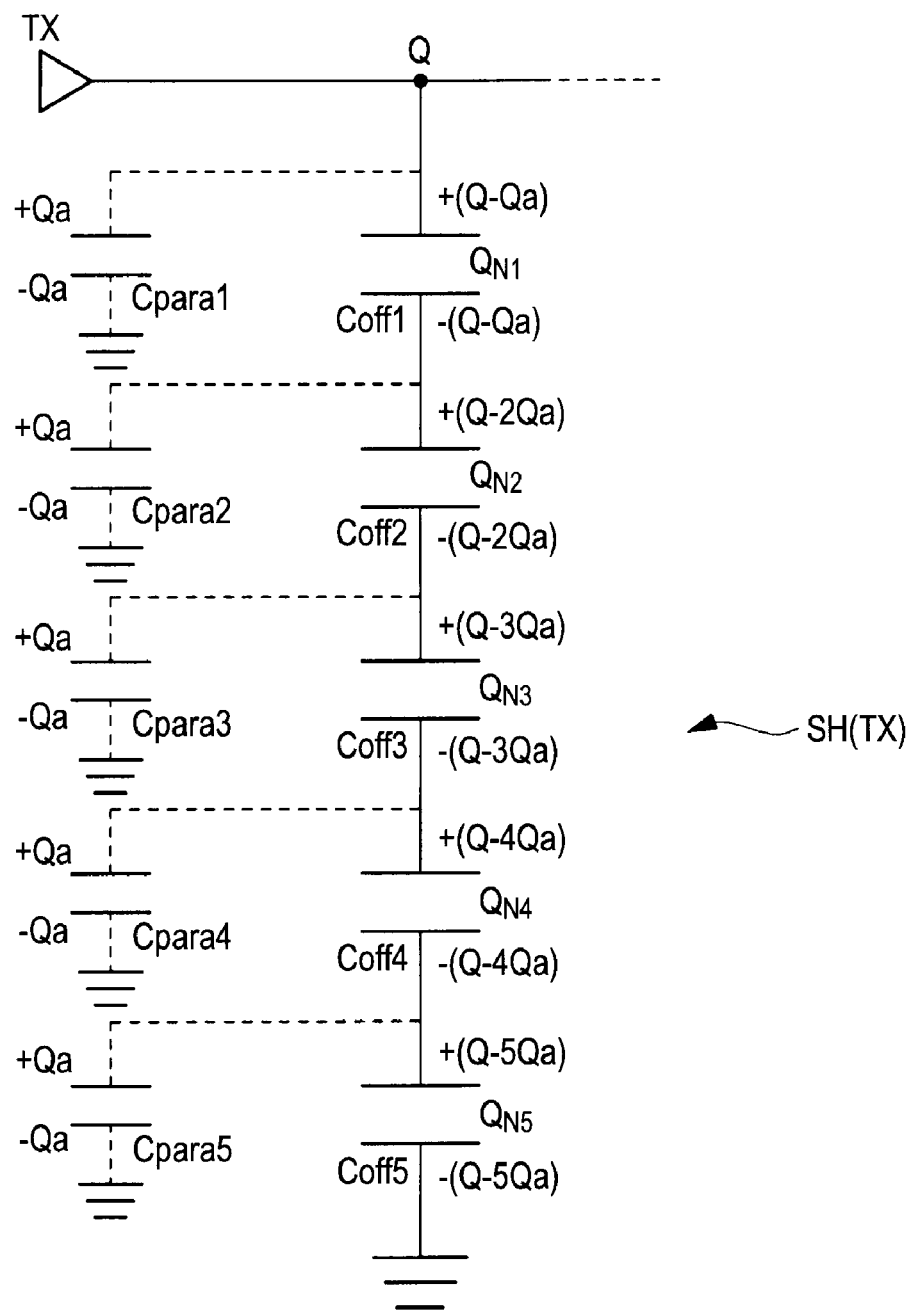
FIG. 7 illustrates a mechanism in which a nonuniformity of the voltage amplitude applied to each of the MISFETs constituting the TX shunt transistor is generated.

FIG. 7 shows an equivalent circuit of the low voltage MISFETs $Q_{N1}$ to $Q_{N5}$ coupled in series between the transmission terminal TX and the GND terminal. That is, between the transmission terminal TX and the GND terminal there is formed the TX shunt transistor SH (TX) including the serially-coupled low voltage MISFETs $Q_{N1}$ to $Q_{N5}$. FIG. 7 shows a state when a transmission signal is transmitted, and here the TX shunt transistor SH (TX) is off. In this state, all of the low voltage MISFETs $Q_{N1}$ to $Q_{N5}$ constituting the TX shunt transistor SH (TX) are off. Accordingly, the off low voltage MISFETs $Q_{N1}$ to $Q_{N5}$ can be represented, respectively, by off capacitances Coff1-Coff5 generated between the source region and the drain region. Accordingly, in FIG. 7, the low voltage MISFETs $Q_{N1}$ to $Q_{N5}$ coupled in series are shown with five off capacitances Coff1 to Coff5 coupled in series. Since the low voltage MISFETs $Q_{N1}$ to $Q_{N5}$ have a similar structure to each other, the five off capacitances Coff1 to Coff5 shown as the equivalent circuit have a similar electrostatic capacitance value. Then, in FIG. 7, the respective parasitic capacitances (to the GND potential) present in the respective MISFETs $Q_{N1}$ to $Q_{N5}$ are shown as parasitic capacitors Cpara1 to Cpara5. The parasitic capacitances Cpara1-Cpara5 are formed corresponding to the respective off capacitances Coff1 to Coff5.

In the equivalent circuit diagram shown in FIG. 7, consider a case where the power of a transmission signal is applied to the transmission terminal TX and a charge amount Q is generated on the transmission terminal TX side. At this time, assuming that there are no parasitic capacitances Cpara1 to Cpara5, then the charge amounts stored in the off capacitances Coff1 to Coff5 are all the same charge amount Q. Accordingly, in an ideal state where there are no parasitic capacitances Cpara1 to Cpara5, the capacitance values of the off capacitances Coff1 to Coff5 are the same and the charge amounts stored therein are the charge amount Q, and therefore the voltage amplitude applied to each of the off capacitances Coff1 to Coff5 is equal to each other.

However, actually, there are the parasitic capacitances Cpara1 to Cpara5. For this reason, for example, a charge amount Qa of the charge amounts Q will be stored in the parasitic capacitance Cpara1 and thus a charge amount Q-Qa will be stored in the off capacitance Coff1. Furthermore, since the charge amount Qa is stored in the parasitic capacitance Cpara2, a charge amount Q-2Qa will be stored in the off capacitance Coff2. Likewise, a charge amount Q-3Qa is stored in the off capacitance Coff3, and a charge amount Q-4Qa is stored in the off capacitance Coff4. Then, a charge amount Q-5Qa will be stored in the off capacitance Coff5. From this, taking into account the parasitic capacitances Cpara1 to Cpara5, the charge amounts stored in the off capacitances Coff1 to Coff5 will differ from each other. Specifically, the charge amount stored in the off capacitance Coff1 closest to the transmission terminal TX is the largest (charge amount of Q-Qa), and the further from the transmission terminal TX and the closer to the GND terminal, the smaller the charge amount stored in the off capacitance becomes. Then, the charge amount stored in the off capacitance Coff5 coupled to the GND terminal is the smallest (charge amount of Q-5Qa). At this time, since the electrostatic capacitance values of the off capacitances Coff1 to Coff5 are similar to each other, the voltage amplitude applied to the off capacitances Coff1 to Coff5, respectively, is proportional to the charge amount stored in the off capacitances Coff1 to Coff5, respectively. In this case, since the charge amounts stored in the off capacitances Coff1 to Coff5 differ from each other, the voltage amplitudes applied to the off capacitances Coff1 to Coff5 are not uniform, or nonuniform. Specifically, the voltage amplitude applied to the off capacitance Coff1 is the largest, and the applied voltage amplitude decreases gradually from the off capacitance Coff2 to the off capacitance Coff4. Then, at the off capacitance Coff5 coupled to the GND terminal, the applied voltage amplitude is the smallest. Accordingly, when the parasitic capacitances Cpara1 to Cpara5 are not taken into consideration, one fifth of the maximum voltage amplitude applied between the transmission terminal TX and the GND terminal is the largest voltage amplitude applied to the respective off capacitances Coff1 to Coff5. On the other hand, actually, there are the parasitic capacitances Cpara1 to Cpara5, and therefore the voltage amplitudes applied to the off capacitances Coff1 to Coff5 are nonuniform as described above. For example, since the largest voltage is applied to the off capacitance Coff1, a large voltage amplitude no less than one fifth of the maximum voltage amplitude that is applied between the transmission terminal TX and the GND terminal is the largest voltage amplitude applied to the off capacitance Coff1.

As apparent from the above, taking into consideration the parasitic capacitances when the TX shunt transistor SH (TX) provided between the transmission terminal TX and the GND terminal is off, the voltage amplitude applied to each of the MISFETs $Q_{N1}$ to $Q_{N5}$ constituting the TX shunt transistor SH (TX) becomes nonuniform.

Figure 8:
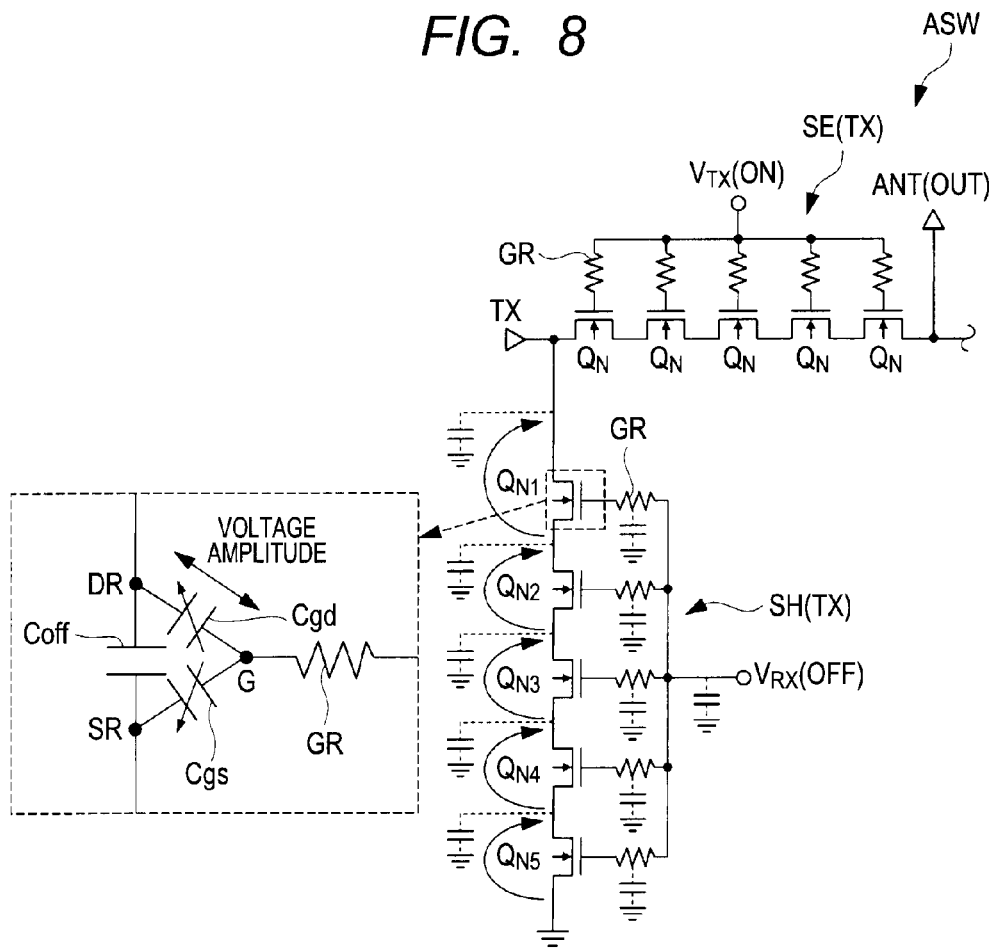
FIG. 8 illustrates generation of high-order harmonics as a result of generation of the nonuniformity of the voltage amplitude applied to each of the MISFETs constituting the TX shunt transistor.

Next, how the generation of high-order harmonics increases when the voltage amplitude applied to each of the MISFETs $Q_{N1}$ to $Q_{N5}$ becomes nonuniform is described. FIG. 8 illustrates an equivalent circuit of the five low-voltage MISFETs $Q_{N1}$ to $Q_{N5}$ constituting the TX shunt transistor SH (TX) when the TX shunt transistor SH (TX) provided between the transmission terminal TX and the GND terminal is off. As shown in FIG. 8, the respective low voltage MISFETs $Q_{N1}$ to $Q_{N5}$, when they are off, can be represented by a off capacitance Coff formed between a drain region DR and a source region SR, a capacitance Cgd formed between the drain region DR and the gate electrode G, and a capacitance Cgs formed between the source region SR and the gate electrode G. At this time, although the electrostatic capacitance value of the off capacitance Coff formed between the drain region DR and the source region SR is constant, the capacitance Cgd formed between the drain region DR and the gate electrode G and the capacitance Cgs formed between the source region SR and the gate electrode G are variable capacitances. This is because the width of a depletion layer formed in a diffusion layer (semiconductor region) constituting the source region SR and the drain region DR varies. That is, for the capacitance Cgd and the capacitance Cgs, there is a dependency of the electrostatic capacitance value on an applied voltage value.

Figure 9:
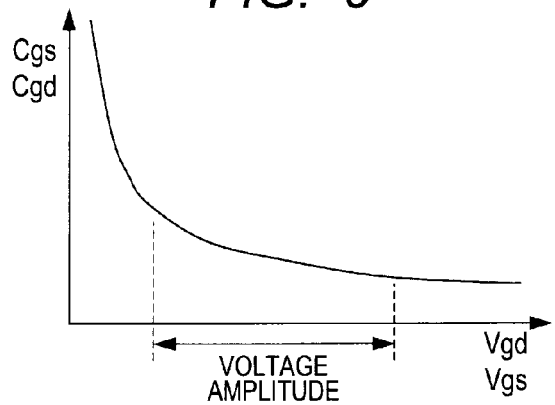
FIG. 9 is a graph showing existence of a voltage dependency in a source-gate capacitance and a drain-gate capacitance.

FIG. 9 is a graph showing a relationship between the capacitance Cgd (the capacitance Cgs) and a voltage Vgd applied between the gate electrode G and the drain region DR (a voltage Vgs applied between the gate electrode G and the source region SR). As apparent from FIG. 9, the capacitance Cgd (the capacitance Cgs) varies greatly with respect to the voltage Vgd (the voltage Vgs). Then, this curve indicative of the variation in the capacitance Cgd (the capacitance Cgs) shows that the curve includes a lot of nonlinear components. Accordingly, the higher the voltage amplitude applied to the voltage Vgd (voltage Vgs), the larger the variation of the electrostatic capacitance value of the capacitance Cgd (the capacitance Cgs) becomes, as well. Since the capacitance variation in the capacitance Cgd (the capacitance Cgs) is nonlinear as also apparent from FIG. 9, high-order harmonics are generated in accordance with the variation in the nonlinear capacitance Cgd (the capacitance Cgs).

The voltage amplitude applied to each of the MISFETs $Q_{N1}$ to $Q_{N5}$ constituting the TX shunt transistor SH (TX) becomes nonuniform and consequently the voltage amplitude applied to the low voltage MISFET $Q_{N1}$ coupled closest to the transmission terminal TX increases. This voltage amplitude is the one applied between the source region and the drain region of the low voltage MISFET $Q_{N1}$. The fact that the voltage amplitude applied between the source region and the drain region of the low voltage MISFET $Q_{N1}$ increases simultaneously means that the voltage amplitude applied between the source region and the gate electrode of the low voltage MISFET $Q_{N1}$ or the voltage amplitude applied between the drain region and the gate electrode increases. Accordingly, the variation in the voltage Vgd or voltage Vgs of the low voltage MISFET $Q_{N1}$ will also increase, and depending on this variation the capacitance variation of the capacitance Cgd (capacitance Cgs) will increase. As a result, high-order harmonics will increase reflecting on the nonlinearity of the capacitance variation. That is, in the comparative example, the voltage amplitude applied to each of the MISFETs $Q_{N1}$ to $Q_{N5}$ constituting the TX shunt transistor SH (TX) becomes nonuniform. Therefore, the voltage amplitude applied to the low voltage MISFET QN1 coupled closest to the transmission terminal TX increases more than necessary, thereby increasing the generation of high-order harmonics.

Furthermore, in the comparative example, an increase in the generation of high-order harmonics is described. For example, a large parasitic capacitance increases the nonuniformity of the voltage amplitude applied to each of the MISFETs $Q_{N1}$ to $Q_{N5}$ constituting the TX shunt transistor SH (TX). In this case, for example, the voltage amplitude applied to the low voltage MISFET $Q_{N1}$ is extremely larger than an average value of the uniformly divided voltage amplitudes. For this reason, the voltage applied between the source region and the drain region of the low voltage MISFET $Q_{N1}$ may exceed the breakdown voltage (breakdown voltage BVds between the source region and the drain region) of the low voltage MISFET $Q_{N1}$. On the other hand, for example, in the low voltage MISFET $Q_{N5}$ coupled to the GND terminal, the voltage amplitude applied thereto is smaller than the average value of the uniformly divided voltage amplitudes. If the nonuniformity of the voltage amplitude applied to each of the MISFETs $Q_{N1}$ to $Q_{N5}$ constituting the TX shunt transistor SH (TX) increases in this manner, then particularly the breakdown of only the low voltage MISFET $Q_{N1}$, to which a large voltage amplitude is applied, will occur. Then, the generation of high-order harmonics from the broken-down low voltage MISFET $Q_{N1}$ will increase.

Figure 10:
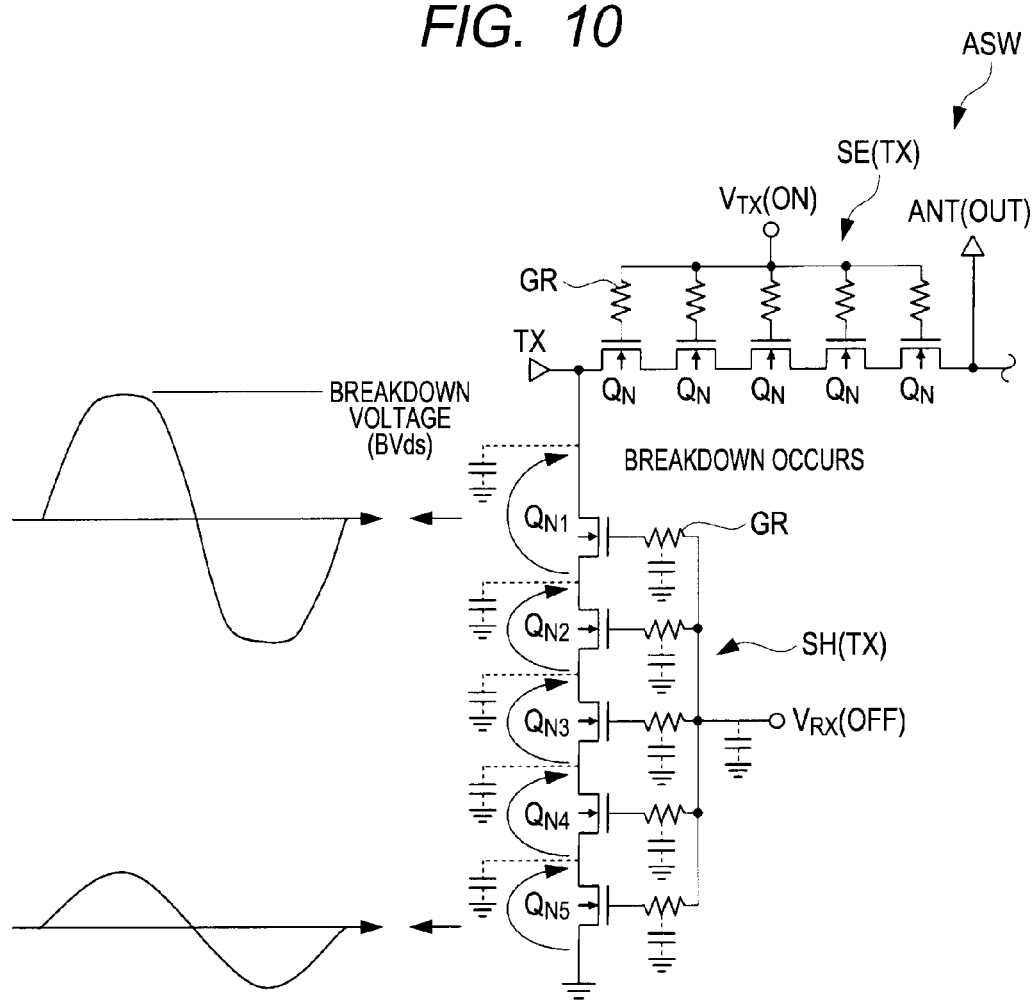
FIG. 10 illustrates generation of high-order harmonics as a result of generation of the nonuniformity of the voltage amplitude applied to each of the MISFETs constituting the TX shunt transistor.

FIG. 10 shows the broken-down low voltage MISFET $Q_{N1}$ and a voltage waveform associated with the low voltage MISFET $Q_{N1}$ and the low voltage MISFET $Q_{N5}$, which is not broken down, and a voltage waveform associated with the low voltage MISFET $Q_{N5}$. In FIG. 10, the voltage waveform of the low voltage MISFET $Q_{N5}$, which is not broken down, has a shape close to a sine wave and is less likely to generate nonlinear components. On the other hand, the voltage waveform of the broken-down low voltage MISFET $Q_{N1}$ varies as if the upper part of the sine wave is clipped, so the nonlinearity will abruptly increase. For this reason, from the broken-down low voltage MISFET $Q_{N1}$, the generation of high-order harmonics due to the nonlinearity will increase.

As apparent from the above, high-order harmonics output from the antenna switch are generated mainly from the TX shunt transistor SH (TX), which is off, and in particular, when the nonuniformity of the voltage amplitude applied to each of the low voltage MISFETs $Q_{N1}$ to $Q_{N5}$ constituting the TX shunt transistor SH (TX) increases, the generation of high-order harmonics will increase. Accordingly, in order to suppress the high-order harmonics output from the antenna switch, it is enough if the nonuniformity of the voltage amplitude applied to each of the low voltage MISFETs $Q_{N1}$ to $Q_{N5}$ constituting the TX shunt transistor SH (TX) can be suppressed. Then, in an antenna switch in the first embodiment shown below, a technical idea capable of suppressing the nonuniformity of the voltage amplitude applied to each of the low voltage MISFETs $Q_{N1}$ to $Q_{N5}$ constituting the TX shunt transistor SH (TX) will be described.

<Circuit Configuration of the Antenna Switch in the First Embodiment>

The circuit configuration of the antenna switch in the first embodiment is described. Although mainly the circuit configuration of the antenna switch ASW used in the single band portable telephone 1 shown in FIG. 1 will be described in this specification, the circuit configuration of the antenna switch ASW used in the dual band portable telephone 1 shown in FIG. 2 is also almost the same.

Figure 11:
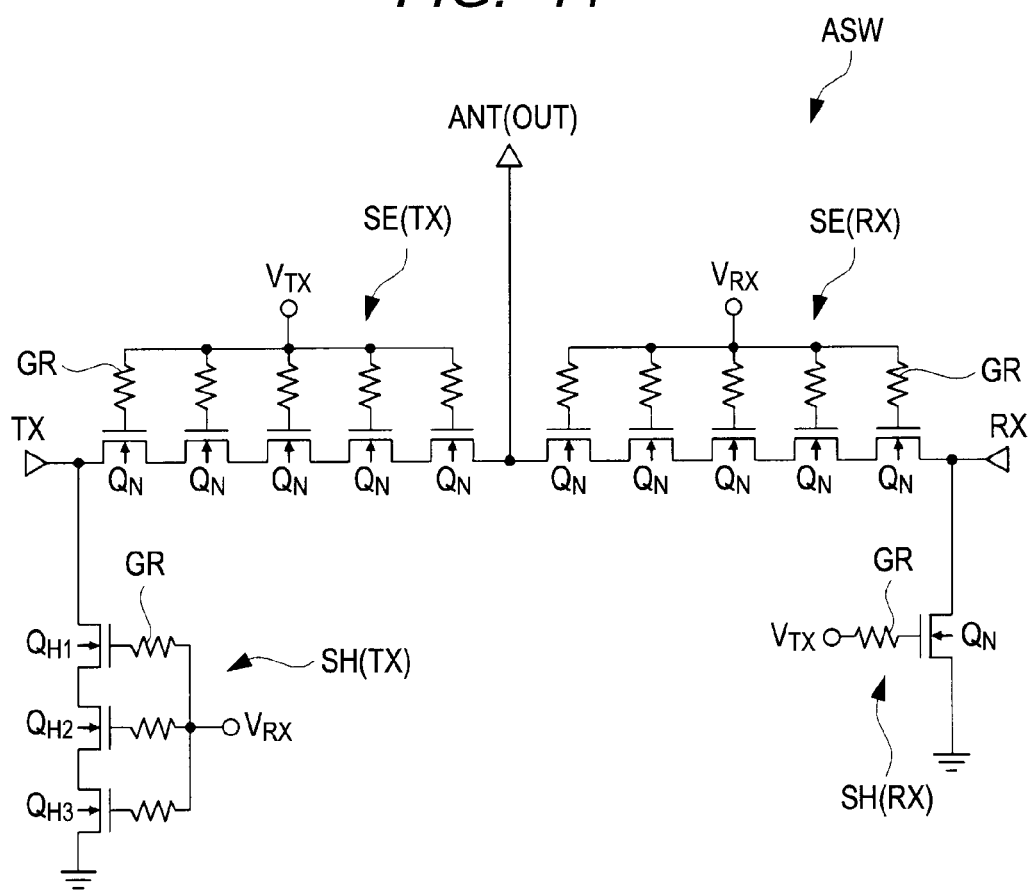
FIG. 11 shows a circuit configuration of an antenna switch in the first embodiment.

FIG. 11 shows a circuit configuration of the antenna switch ASW in the first embodiment. As shown in FIG. 11, the antenna switch ASW in the first embodiment has the transmission terminal TX, the reception terminal RX, and the antenna terminal ANT (OUT). Then, the antenna switch ASW in the first embodiment includes the TX series transistor SE (TX) between the transmission terminal TX and the antenna terminal ANT (OUT), and includes the RX series transistor SE (RX) between the reception terminal RX and the antenna terminal ANT (OUT). Furthermore, the antenna switch ASW in the first embodiment includes the TX shunt transistor SH (TX) between the transmission terminal TX and the GND terminal, and includes the RX shunt transistor SH (RX) between the reception terminal RX and the GND terminal. The transmission terminal TX formed in the antenna switch ASW is electrically coupled to the power amplifier HPA shown in FIG. 1, and the reception terminal RX is electrically coupled to the low noise amplifier LNA shown in FIG. 1. At this time, since the low noise amplifier LNA is a part of the reception circuit, the reception terminal RX of the antenna switch ASW is electrically coupled to the reception circuit. Furthermore, the antenna terminal ANT (OUT) formed in the antenna switch ASW is electrically coupled to the antenna ANT shown in FIG. 1.

The TX series transistor SE (TX) includes five low-voltage MISFETs $Q_N$ coupled in series, for example. At this time, each low-voltage MISFET $Q_N$ has a source region, a drain region, and a gate electrode. In this specification, although the source region and the drain region of the low voltage MISFET $Q_N$ are in a symmetrical relation, in the low voltage MISFETs $Q_N$ constituting the TX series transistor SE (TX) a region on the transmission terminal TX side shall be defined as the drain region, and a region on the antenna terminal ANT (OUT) side as the source region. Furthermore, the gate electrode of the low voltage MISFET $Q_N$ is coupled to the control terminal $V_{TX}$ via the gate resistance GR. The gate resistance GR is an isolation resistor for preventing high frequency signals from leaking into the control terminal $V_{TX}$. In other words, the gate resistance GR has the function to attenuate high frequency signals. In the TX series transistor SE (TX) thus configured, the on/off of the low voltage MISFETs $Q_N$ coupled in series is controlled by controlling the voltage applied to the control terminal $V_{TX}$, so that the transmission terminal TX and the antenna terminals ANT (OUT) may be electrically coupled to each other or electrically isolated from each other. That is, the TX series transistor SE (TX) functions as a switch to switch electrical connection/disconnection between the transmission terminal TX and the antenna terminal ANT (OUT). The reason why the low voltage MISFET $Q_N$ is used as the MISFET constituting the TX series transistor SE (TX) is that when the transmission terminal TX and the antenna terminal ANT (OUT) are electrically coupled to each other and a transmission signal is transmitted, the power loss is reduced by reducing the on-resistance of the transmission path.

Subsequently, the RX series transistor SE (RX) also includes five low-voltage MISFETs $Q_N$ coupled in series, for example, as with the TX series transistor SE (TX). At this time, each low-voltage MISFET $Q_N$ has a source region, a drain region, and a gate electrode. In this specification, although the source region and the drain region of the low voltage MISFET $Q_N$ are in a symmetrical relation, in the low voltage MISFETs $Q_N$ constituting the RX series transistor SE (RX) a region on the antenna terminal ANT (OUT) side shall be defined as the drain region, and a region on the reception terminal RX side as the source region. Furthermore, the gate electrode of the low voltage MISFET $Q_N$ is coupled to the control terminal $V_{RX}$ via the gate resistance GR. The gate resistance GR is an isolation resistor for preventing high frequency signals from leaking into the control terminal $V_{RX}$. In other words, the gate resistance GR has the function to attenuate high frequency signals. In the RX series transistor SE (RX) thus configured, the on/off of the low voltage MISFETs $Q_N$ coupled in series is controlled by controlling the voltage applied to the control terminal $V_{RX}$, so that the transmission terminal RX and the antenna terminals ANT (OUT) may be electrically coupled to each other or electrically isolated from each other. That is, the RX series transistor SE (RX) functions as a switch to switch electrical connection/disconnection between the reception terminal RX and the antenna terminal ANT (OUT). The reason why the low voltage MISFET $Q_N$ is used as the MISFET constituting the RX series transistor SE (RX) is that when the reception terminal RX and the antenna terminal ANT (OUT) are electrically coupled to each other and a reception signal is transmitted, the power loss is reduced by reducing the on-resistance of the reception path.

Next, the RX shunt transistor SH (RX) includes one low voltage MISFET $Q_N$, for example. In this case, the low voltage MISFET $Q_N$ has a source region, a drain region, and a gate electrode. In this specification, although the source region and the drain region of the low voltage MISFET $Q_N$ are in a symmetrical relation, in the low voltage MISFET $Q_N$ constituting the RX shunt transistor SH (RX) a region on the reception terminal RX side shall be defined as the drain region, and a region on the GND terminal side as the source region. Furthermore, the gate electrode of the low voltage MISFET $Q_N$ is coupled to the control terminal $V_{TX}$ via the gate resistance GR. The gate resistance GR is an isolation resistor for preventing high frequency signals from leaking into the control terminal $V_{TX}$. In other words, the gate resistance GR has the function to attenuate high frequency signals.

Here, the reason why a plurality of low voltage MISFETs $Q_N$ is not coupled in series in the RX shunt transistor SH (RX) is that even one low voltage MISFET $Q_N$ can sufficiently secure the breakdown voltage because only a micro-power reception signal flows into the reception terminal RX at the time of reception. Furthermore, the low voltage MISFET $Q_N$ is used as the RX shunt transistor SH (RX) because the on-resistance can be reduced. That is, when the RX shunt transistor SH (RX) is turned on, the reception terminal RX and the GND terminal will be electrically coupled to each other, however, in this case, if the on-resistance of the RX shunt transistor SH (RX) is high, the impedance between the reception terminal RX and the GND terminal will increase and consequently a transmission signal leaking to the reception terminal RX side cannot be sufficiently reflected at the reception terminal RX.

<Circuit Configuration (Characteristic Configuration) of the Antenna Switch in the First Embodiment>

In FIG. 11, the TX shunt transistor SH (TX) includes three high-voltage MISFETs $Q_{H1}$ to $Q_{H3}$ coupled in series, for example. In this case, each of the high voltage MISFETs $Q_{H1}$ to $Q_{H3}$ has a source region, a drain region, and a gate electrode. In this specification, although the source region and the drain region of the respective high voltage MISFETs $Q_{H1}$ to $Q_{H3}$ are in a symmetrical relation, in the high voltage MISFETs $Q_{H1}$ to $Q_{H3}$ constituting the TX shunt transistor SH (TX) a region on the transmission terminal TX side shall be defined as the drain region, and a region on the GND terminal side as the source region. Furthermore, the gate electrode of the respective high voltage MISFETs $Q_{H1}$ to $Q_{H3}$ is coupled to the control terminal $V_{RX}$ via the gate resistance GR. The gate resistance GR is an isolation resistor for preventing high frequency signals from leaking into the control terminal $V_{RX}$. In other words, the gate resistance GR has the function to attenuate high frequency signals.

Here, the first embodiment is characterized in that the TX shunt transistor SH (TX) includes three high-voltage MISFETs $Q_{H1}$ to $Q_{H3}$ coupled in series, for example. That is, in the comparative example, the TX shunt transistor SH (TX) includes five low-voltage MISFETs $Q_{N1}$ to $Q_{N5}$ coupled in series, for example, however, in the first embodiment, the high voltage MISFETs $Q_{H1}$ to $Q_{H3}$ whose breakdown voltage between the source region and the drain region is higher than that of the low voltage MISFETs $Q_{N1}$ to $Q_{N5}$ are used, and three high-voltage MISFETs $Q_{H1}$ to $Q_{H3}$ are coupled in series to form the TX shunt transistor SH (TX).

Use of the high voltage MISFETs $Q_{H1}$ to $Q_{H3}$ can improve the breakdown voltage of the individual MISFETs. Therefore, the TX shunt transistor SH (TX) can include three high-voltage MISFETs $Q_{H1}$ to $Q_{H3}$ which is fewer than when it includes five low-voltage MISFETs $Q_{N1}$ to $Q_{N5}$ coupled in series. As a result, the nonuniformity of the voltage amplitude applied to each of the high voltage MISFETs $Q_{H1}$ to $Q_{H3}$ constituting the TX shunt transistor SH (TX) can be suppressed and the generation of high-order harmonics due to the nonuniformity of the voltage amplitudes can be reduced.

Hereinafter, the capability to suppress the nonuniformity of the voltage amplitude applied to each of the high voltage MISFETs $Q_{H1}$ to $Q_{H3}$ constituting the TX shunt transistor SH (TX) will be described with reference to the accompanying drawings.

Figure 12:
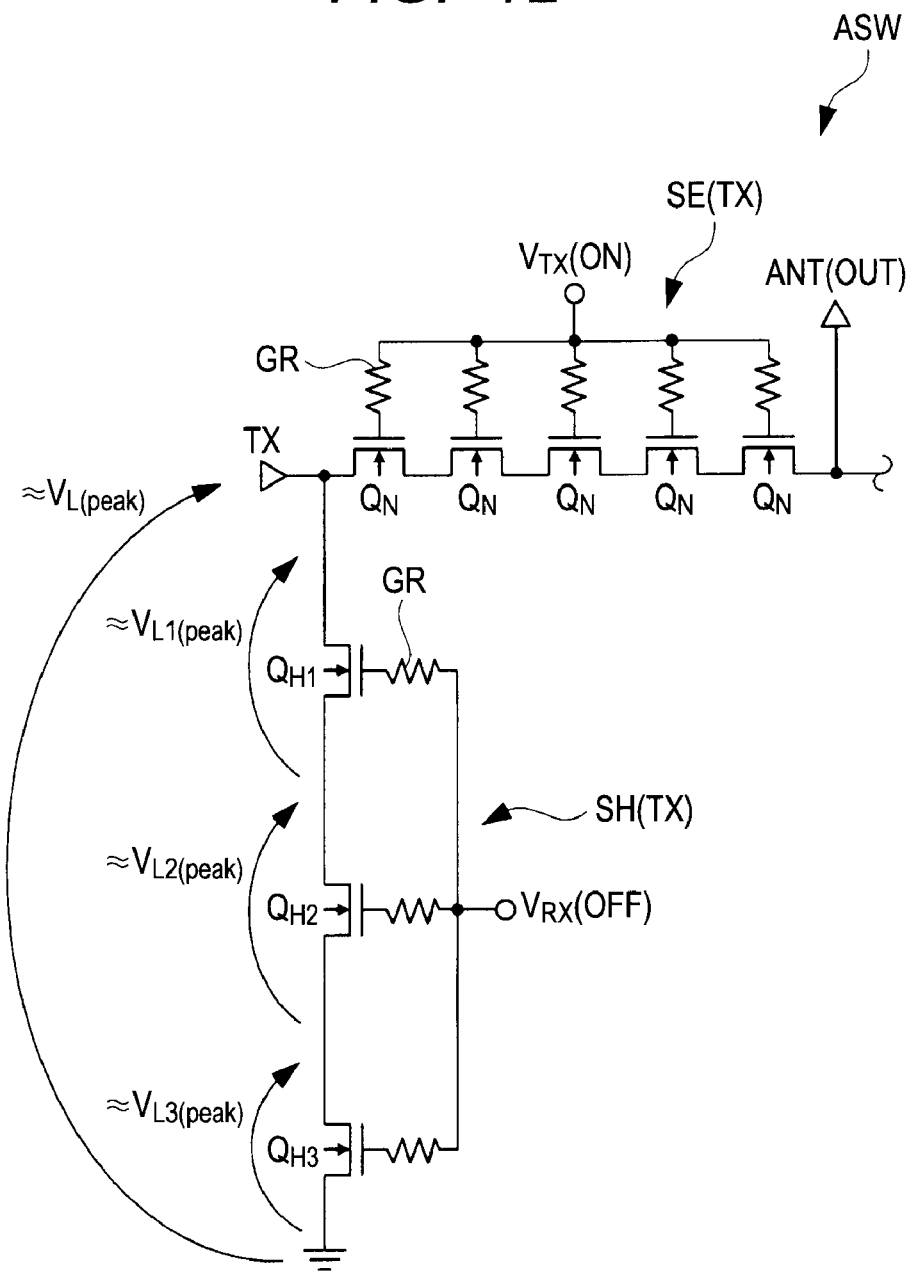
FIG. 12 shows a state where a voltage amplitude applied to each of the MISFETs constituting the TX shunt transistor becomes nonuniform.

FIG. 12 shows voltage amplitudes applied to the TX shunt transistor SH (TX) when a transmission signal is transmitted from the transmission terminal TX to the antenna terminal ANT (OUT) of the antenna switch ASW. Since FIG. 12 shows a case where a transmission signal is transmitted from the transmission terminal TX to antenna terminal ANT (OUT) of the antenna switch ASW, the TX series transistor SE (TX) is on and the TX shunt transistor SH (TX) is off in the antenna switch ASW. At this time, the maximum value of the voltage amplitude applied to the entire TX shunt transistor SH (TX), which is off, is designated by a voltage amplitude $V_{L(peak)}$. Then, voltage amplitudes $V_{L1(peak)}$ to $V_{L3(peak)}$ are applied to the three high-voltage MISFETs $Q_{H1}$ to $Q_{H3}$ constituting the TX shunt transistor SH (TX), respectively.

At this time, if the parasitic capacitances due to the high voltage MISFETs $Q_{H1}$ to $Q_{H3}$, a parasitic capacitance due to the gate resistance GR, and a parasitic capacitance due to wirings are taken into consideration, then also in the TX shunt transistor SH (TX) in the first embodiment, the nonuniformity is generated in the voltage amplitudes applied to the respective high voltage MISFETs $Q_{H1}$ to $Q_{H3}$ constituting the TX shunt transistor SH (TX). Namely, if the parasitic capacitances are taken into consideration, the first embodiment also satisfies the relationship: voltage amplitude $V_{L1(peak)}$>voltage amplitude $V_{L2(peak)}$>voltage amplitude $V_{L3(peak)}$. Accordingly, also when the TX shunt transistor SH (TX) includes three high-voltage MISFETs $Q_{H1}$ to $Q_{H3}$ as in the first embodiment, the generation of high-order harmonics due to the nonuniformity of the voltage amplitudes might increase as with the case where the TX shunt transistor SH (TX) includes five low-voltage MISFETs $Q_{N1}$ to $Q_{N5}$ as in the comparative example.

However, the decisive difference between the first embodiment and the comparative example is in that the number of MISFETs coupled in series (the number of serial connections, the number of stacks) differs from each other. Specifically, in the first embodiment, the TX shunt transistor SH (TX) includes three high-voltage MISFETs $Q_{H1}$ to $Q_{H3}$, while in the comparative example the TX shunt transistor SH (TX) includes five low-voltage MISFETs $Q_{N1}$ to $Q_{N5}$. In other words, the first embodiment is characterized in that the number of serial connections of the MISFETs constituting the TX shunt transistor SH (TX) is fewer than that of serial connections in the comparative example. If the number of serial connections of the MISFETs constituting the TX shunt transistor SH (TX) is reduced in this manner, the nonuniformity of the voltage amplitude applied to each of the MISFETs coupled in series can be suppressed sufficiently. That is, in the first embodiment, by reducing the number of serial connections of the MISFETs constituting the TX shunt transistor SH (TX), the nonuniformity of the voltage amplitude applied to each of the MISFETs coupled in series is generated to some extent but can be considerably suppressed.

Hereinafter, how the nonuniformity of the voltage amplitude applied to each of the MISFETs is significantly suppressed by reducing the number of serial connections of the MISFETs constituting the TX shunt transistor SH (TX), as in the first embodiment, is described with reference to the accompanying drawings.

Figure 13:
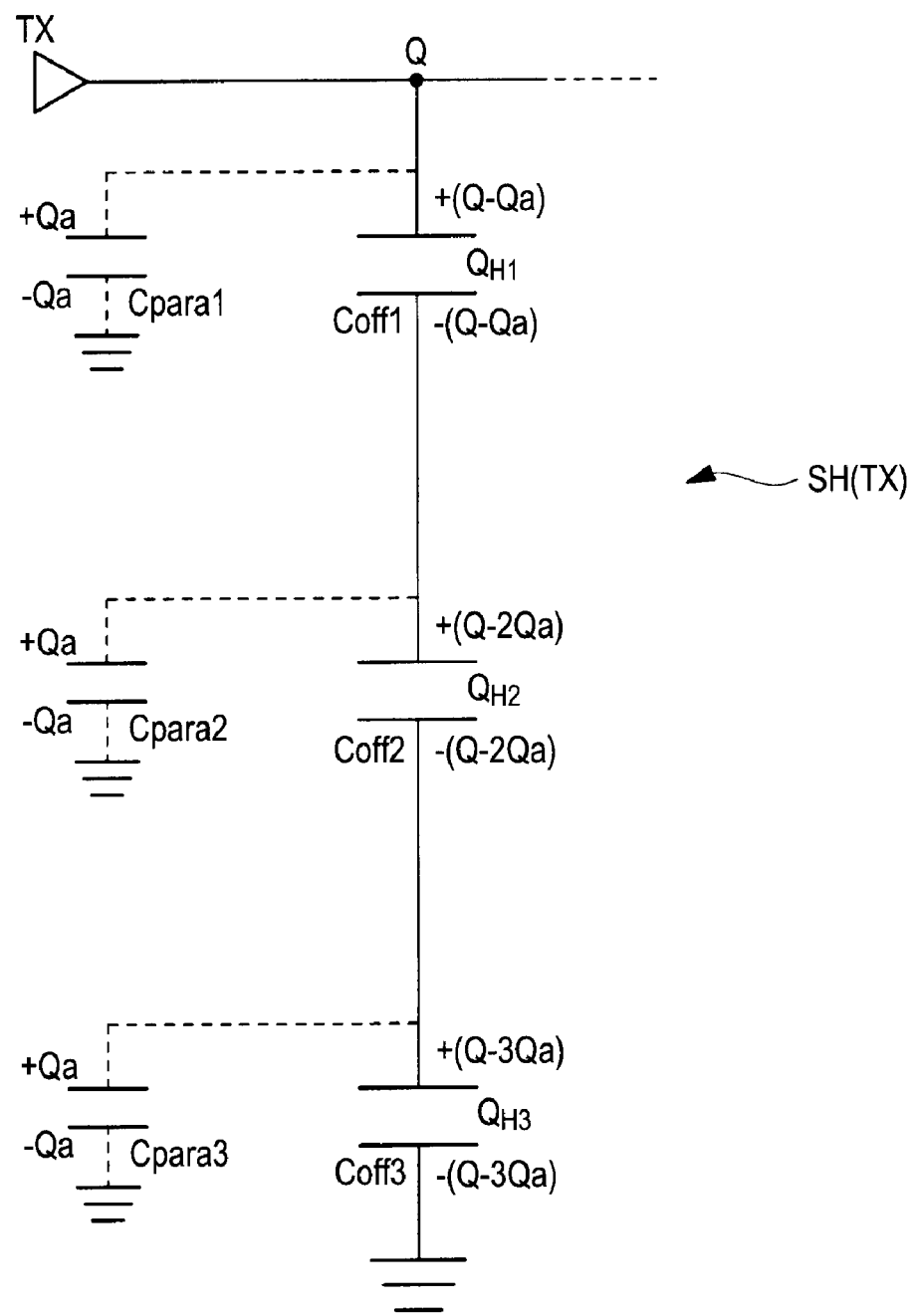
FIG. 13 illustrates a mechanism in which the nonuniformity of the voltage amplitude applied to each of the MISFETs constituting the TX shunt transistor is relieved.

FIG. 13 shows an equivalent circuit of the high voltage MISFETs $Q_{H1}$ to $Q_{H3}$ coupled in series between the transmission terminal TX and the GND terminal. That is, the TX shunt transistor SH (TX) including serially-coupled high voltage MISFETs $Q_{H1}$ to $Q_{H3}$ is formed between the transmission terminal TX and the GND terminal. FIG. 13 shows a state when a transmission signal is transmitted and here the TX shunt transistor SH (TX) is off. In this state, all of the high voltage MISFETs $Q_{H1}$ to $Q_{H3}$ constituting the TX shunt transistor SH (TX) are off. Therefore, the turned-off high voltage MISFETs $Q_{H1}$ to $Q_{H5}$ respectively can be represented by the off capacitances Coff1 to Coff3 generated between the source region and the drain region. Accordingly, in FIG. 13, the serially-coupled high voltage MISFETs $Q_{H1}$ to $Q_{H3}$ are represented by three off capacitances Coff1 to Coff3 coupled in series. Since the high voltage MISFETs $Q_{H1}$ to $Q_{H3}$ have a similar structure to each other, the three off capacitances Coff1 to Coff3 shown as the equivalent circuit have a similar electrostatic capacitance value. Then, in FIG. 13, parasitic capacitances (to the GND potential) present in the respective high voltage MISFETs $Q_{H1}$ to $Q_{H3}$ are represented by parasitic capacitance Cpara1 to Cpara3. These parasitic capacitances Cpara1 to Cpara3 are formed corresponding to the respective off capacitances Coff1 to Coff3. As described above, in the first embodiment, three off capacitances Coff1 to Coff3 and three parasitic capacitances Cpara1 to Cpara3 can constitute the equivalent circuit of the TX shunt transistor SH (TX). On the other hand, in the comparative example, as shown in FIG. 7, five off capacitances Coff1 to Coff5 and five parasitic capacitances Cpara1 to Cpara5 constitute the equivalent circuit of the TX shunt transistor SH (TX). Accordingly, the difference between the first embodiment and the comparative example is in the number of off capacitances and the number of parasitic capacitances, and this is due to the difference in the number of serial connections of the MISFETs constituting the TX shunt transistor SH (TX).

In the equivalent circuit diagram shown in FIG. 13, consider a case where the power of a transmission signal is applied to the transmission terminal TX and a charge amount Q is generated on the transmission terminal TX side. Due to the presence of the parasitic capacitances Cpara1t to Cpara3, the charge amount Qa out of the charge amounts Q will be stored in the parasitic capacitance Cpara1. Thus, the charge amount Q-Qa will be stored in the off capacitance Coff1. Furthermore, since the charge amount Qa is stored in the parasitic capacitance Cpara2, a charge amount Q-2Qa will be stored in the off capacitance Coff2. Likewise, a charge amount Q-3Qa will be stored in the off capacitance Coff3. Accordingly, also in the first embodiment, if the parasitic capacitances Cpara1 to Cpara3 are taken into consideration, the charge amounts stored in the off capacitances Coff1 to Coff3 will differ from each other. Specifically, the charge amount stored in the off capacitance Coff1 closest to the transmission terminal TX is the largest (the charge amount of Q-Qa), and the charge amount stored in the off capacitance Coff3 coupled to the GND terminal is the smallest (the charge amount Q-3Qa). At this time, since the electrostatic capacitance values of the off capacitances Coff1 to Coff3 are similar to each other, the voltage amplitude applied to the off capacitances Coff1 to Coff3, respectively, is proportional to the charge amount stored in the off capacitances Coff1 to Coff3, respectively. In this case, since the charge amounts stored in the off capacitances Coff1 to Coff3 differ from each other, the voltage amplitudes applied to the off capacitances Coff1 to Coff3 are not uniform, or nonuniform. Specifically, the voltage amplitude applied to the off capacitance Coff1 is the largest, and the voltage amplitude to be applied is the smallest at the off capacitance Coff3 coupled to the GND terminal.

However, comparing the first embodiment with the comparative example, the nonuniformity of the voltage amplitudes applied to the off capacitances Coff1 to Coff3 can be suppressed if the number of serial connections of the MISFETs constituting the TX shunt transistor SH (TX) is reduced as with the first embodiment. That is, in this case, since the voltage amplitude applied to the respective off capacitances Coff1 to Coff3 is proportional to the charge amount stored in the respective off capacitances Coff1 to Coff3, the smaller the difference of the charge amounts stored in the off capacitances Coff1 to Coff3, the smaller the nonuniformity of the voltage amplitudes applied to the off capacitances Coff1 to Coff3 becomes. Taking this into consideration, since five off capacitances Coff1 to Coff5 are coupled in series in the comparative example, as shown in FIG. 7, the charge amount is Q-Qa in the off capacitance Coff1 having the largest charge amount stored therein while in the off capacitance Coff5 having the smallest charge amount stored therein, the charge amount is Q-5Qa. Accordingly, in the comparative example, the difference between the charge amount stored in the off capacitance Coff1 and the charge amount stored in the off capacitance Coff5 is 4Qa.

On the other hand, in the first embodiment, as shown in FIG. 13, since three off capacitances Coff1 to Coff3 are coupled in series, the charge amount is Q-Qa in the off capacitance Coff1 having the largest charge amount stored therein while in the off capacitance Coff3 having the smallest charge amount stored therein, the charge amount is Q-3Qa. Accordingly, in the first embodiment, the difference between the charge amount stored in the off capacitance Coff1 and the charge amount stored in the off capacitance Coff3 is 2Qa. Thus, in the first embodiment, the difference in the charge amounts stored in the off capacitance having the largest charge amount stored therein and in the off capacitance having the smallest charge amount stored therein is small as compared with that in the comparative example. This means the nonuniformity of the voltage amplitudes applied to the off capacitances in the first embodiment is smaller than that of the comparative example.

As apparent from the above, the nonuniformity of the voltage amplitude applied to each of the MISFETs can be significantly suppressed by reducing the number of serial connections of the MISFETs constituting the TX shunt transistor SH (TX). Accordingly, in particular, the breakdown of only certain MISFET (e.g., MISFET coupled to the transmission terminal TX), to which a large voltage amplitude is applied, can be suppressed. As a result, a significant effect of suppressing an increase of high-order harmonics that are generated from a broken down MISFET can be obtained.

The technical idea in the first embodiment is characterized in that the nonuniformity of the voltage amplitude applied to each of the MISFETs coupled in series is suppressed by reducing the number of serial connections of the MISFETs constituting the TX shunt transistor SH (TX). Then, this configuration cannot be achieved just by reducing the number of serial connections of the low voltage MISFETs in the comparative example. Because, if the number of serial connections of the MISFETs constituting the TX shunt transistor SH (TX) is reduced, the magnitude of the voltage amplitude applied to each of the MISFETs will increase, and therefore the breakdown voltage of the MISFET needs to be improved so as not to break down even when a larger voltage amplitude is applied thereto. Accordingly, when the number of serial connections of the MISFETs constituting the TX shunt transistor SH (TX) is reduced as in the first embodiment, the breakdown voltage of each of the MISFETs needs to be improved and it is therefore necessary to use a high voltage MISFET.

Here, in the comparative example, the TX shunt transistor SH (TX) includes five serially-coupled low voltage MISFETs $Q_{N1}$ to $Q_{N5}$, while in the first embodiment the TX shunt transistor SH (TX) includes three serially-coupled high voltage MISFETs $Q_{H1}$ to $Q_{H3}$. For this reason, in the first embodiment, the nonuniformity of the voltage amplitude applied to each of the MISFETs coupled in series can be suppressed by reducing the number of serial connections of the MISFETs constituting the TX shunt transistor SH (TX). Thus, the nonuniformity of the voltage amplitude applied to each of the MISFETs coupled in series might be further suppressed by further reducing the number of serial connections of the MISFETs constituting the TX shunt transistor SH (TX). That is, in view of reducing the nonuniformity of the voltage amplitude applied to each of the MISFETs coupled in series, a fewer number of serial connections of the MISFETs constituting the TX shunt transistor SH (TX) is more preferable.

Then, for example, the TX shunt transistor SH (TX) might include one high voltage MISFET. In this case, this one high voltage MISFET is assumed to have a breakdown voltage such that it may not break down even if the largest voltage amplitude is applied between the transmission terminal TX and the GND terminal.

However, in the first embodiment, the TX shunt transistor SH (TX) does not include one high voltage MISFET. Here are the reasons. For example, the case where the TX shunt transistor SH (TX) includes five low-voltage MISFETs $Q_{N1}$ to $Q_{N5}$ coupled in series as in the comparative example, the case where the TX shunt transistor SH (TX) includes three low voltage MISFETs $Q_{N1}$ to $Q_{N5}$ coupled in series as in the first embodiment, and the case where the TX shunt transistor SH (TX) includes one high voltage MISFET are compared and studied.

Here, when the TX shunt transistor SH (TX) is off, assume that all the off capacitances of the respective MISFETs (low voltage MISFETs, high voltage MISFETs) are the same capacitance C. Then, in the comparative example, since five low-voltage MISFETs $Q_{N1}$ to $Q_{N5}$ are coupled in series, five off capacitances are considered to be coupled in series. For this reason, the off capacitance of the TX shunt transistor SH (TX) is a combined capacitance of five off capacitances coupled in series, and the electrostatic capacitance value thereof is C/5. On the other hand, in the first embodiment, since three high-voltage MISFETs $Q_{H1}$ to $Q_{H3}$ are coupled in series, three off capacitances are considered to be coupled in series. Therefore, the off capacitance of the TX shunt transistor SH (TX) is a combined capacitance of three off capacitances coupled in series, and the electrostatic capacitance value thereof is C/3. Furthermore, when the TX shunt transistor SH (TX) includes one high voltage MISFET, the off capacitance of the TX shunt transistor SH (TX) is the off capacitance of one high voltage MISFET, and the electrostatic capacitance value thereof is C.

From this, the off capacitance of the TX shunt transistor SH (TX) increases as the number of serial connections of the MISFETs constituting the TX shunt transistor SH (TX) is reduced. An increase of the off capacitance of the TX shunt transistor SH (TX) means an increase of the transmission signal leaking out to the GND terminal via the TX shunt transistor SH (TX), which is off, from the transmission terminal TX. That is, when a transmission signal is transmitted, the TX series transistor SE (TX) provided between the transmission terminal TX and the antenna terminal ANT (OUT) is turned on and the TX shunt transistor SH (TX) provided between the transmission terminal TX and the GND terminal is turned off. Therefore, the transmission signal is transmitted mainly between the transmission terminals TX and the antenna terminals ANT (OUT) that are electrically coupled to each other, however, if the off capacitance of the TX shunt transistor SH (TX), which is off, increases, a part of the transmission signal will leak out via this large off-capacitance because the transmission signal is a high frequency signal.

As apparent from the above, in view of reducing the transmission signal leaking out from the TX shunt transistor SH (TX), which is off, a reduction in the number of serial connections of the MISFETs constituting the TX shunt transistor SH (TX) should be avoided. On the other hand, in view of reducing the nonuniformity of the voltage amplitude applied to each of the MISFETs coupled in series, it is preferable to reduce the number of serial connections of the MISFETs constituting the TX shunt transistor SH (TX). Accordingly, a reduction of the transmission signal leaking out from the TX shunt transistor SH (TX), which is off, and a reduction in the nonuniformity of the voltage amplitude applied to each of the MISFETs coupled in series are in a trade-off relationship.

Therefore, if the TX shunt transistor SH (TX) includes five low-voltage MISFETs $Q_{N1}$ to $Q_{N5}$ coupled in series as with the comparative example, it is possible to sufficiently reduce the transmission signal leaking from the TX shunt transistor SH (TX), which is off, while the nonuniformity of the voltage amplitude applied to each of the low voltage MISFETs $Q_{N1}$ to $Q_{N5}$ coupled in series will inconveniently increase, resulting in an increase in the generation of high-order harmonics. On the other hand, if the TX shunt transistor SH (TX) includes one high voltage MISFET, the nonuniformity of the voltage amplitudes can be reduced and the generation of high-order harmonics can be reduced, however, the transmission signal leaking from the TX shunt transistor SH (TX), which is off, cannot be sufficiently reduced.

Then, as in the first embodiment, if the TX shunt transistor SH (TX) includes three high-voltage MISFETs $Q_{H1}$ to $Q_{H3}$ coupled in series, then a reduction of the leakage of a transmission signal from the TX shunt transistor SH (TX), which is off, and a reduction in the generation of high-order harmonics that is caused by attempting the reduction in the nonuniformity of the voltage amplitudes, the above both reductions being in a tradeoff relationship, can be both achieved sufficiently. That is, in order to achieve both the reduction of the transmission signal leaking out from the TX shunt transistor SH (TX), which is off, and the reduction in the nonuniformity of the voltage amplitude applied to each of the MISFETs coupled in series, the number of serial connections of the MISFETs constituting the TX shunt transistor SH (TX) needs to be adjusted without being set to an extreme value.

The antenna switch ASW in the first embodiment is configured as described above, and now the operation thereof will be described. First, the operation at the time of transmission is described. In FIG. 11, at the time of transmission, the TX series transistor SE (TX) and the RX shunt transistor SH (RX) are turned on, and also the TX shunt transistor SH (TX) and the RX series transistor SE (RX) are turned off. Thus, the transmission terminal TX and the antenna terminal ANT (OUT) are electrically coupled to each other, and also the reception terminal RX and the antenna terminal ANT (OUT) are electrically isolated from each other. As a result, a transmission signal is output from the transmission terminal TX toward the antenna terminal ANT (OUT). At this time, there is an off capacitance although the RX series transistor SE (RX) is off, so a part of the transmission signal that is a high frequency signal will leak out to the reception terminal RX side via the off capacitance of the RX series transistor SE (RX). However, since the RX shunt transistor SH (RX) is on, the reception terminal RX and the GND terminal are electrically coupled to each other and the impedance between the reception terminal RX and the GND terminal becomes low. For this reason, a transmission signal having leaked out to the reception terminal RX side is sufficiently reflected at the reception terminal RX. As a result, a transmission signal having leaked out is reflected at the reception terminal RX and is again output from the antenna terminal ANT (OUT). Furthermore, the TX shunt transistor SH (TX) provided between the transmission terminal TX and the GND terminal is off, however, since the TX shunt transistor SH (TX) includes three high-voltage MISFETs $Q_{H1}$ to $Q_{H3}$ coupled in series, the nonuniformity of the voltage amplitudes applied to the high voltage MISFETs $Q_{H1}$ to $Q_{H3}$ coupled in series can be reduced and consequently the generation of high-order harmonics can be suppressed. Furthermore, since the off capacitance of the TX shunt transistor SH (TX) can be reduced sufficiently, the transmission signal leaking from the TX shunt transistor SH (TX) can be reduced. In this manner, the transmission signal is output from the antenna terminal ANT (OUT) efficiently.

Next, the operation at the time of reception will be described. In FIG. 3, at the time of reception, the RX series transistor SE (RX) and the TX shunt transistor SH (TX) are turned on, and also the RX shunt transistor SH (RX) and the TX series transistor SE (TX) are turned off. Thus, the reception terminal RX and the antenna terminal ANT (OUT) are electrically coupled to each other, and also the transmission terminal TX and the antenna terminal ANT (OUT) are electrically isolated from each other. As a result, a reception signal is output from the antenna terminal ANT (OUT) toward the reception terminal RX. At this time, there is an off capacitance although the TX series transistor SE (TX) is off, so a part of the reception signal that is a high frequency signal will leak out to the transmission terminal TX side via the off capacitance of the TX series transistor SE (TX). However, since the TX shunt transistor SH (TX) is on, the transmission terminal TX and the GND terminal are electrically coupled to each other and the impedance between the transmission terminal TX and the GND terminal becomes low. At this time, since the TX shunt transistor SH (TX) includes three high-voltage MISFETs $Q_{H1}$ to $Q_{H3}$, the impedance between the transmission terminal TX and the GND terminal may not become low due to an increase of the on-resistance of the high voltage MISFETs $Q_{H1}$ to $Q_{H3}$. However, as compared with the comparative example in which five low-voltage MISFETs having low on-resistances are coupled in series, according to the first embodiment, although the on-resistances of the individual high voltage MISFETs $Q_{H1}$ to $Q_{H3}$ increase, the number of serial connections can be reduced and therefore an increase of the on-resistance as the entire TX shunt transistor SH (TX) can be suppressed. Accordingly, in the first embodiment, as with the comparative example, the impedance between the transmission terminal TX and the GND terminal can be kept low. For this reason, a reception signal having leaked out to the transmission terminal TX side is sufficiently reflected at the transmission terminal TX. As a result, a reception signal having leaked out is reflected at the transmission terminal TX and returns to the reception terminal RX side again. In this manner, the reception signal is efficiently transmitted from the antenna terminal ANT (OUT) to the reception terminal RX side.

<Matter of Study of the Antenna Switch in the First Embodiment>

The first embodiment is characterized in that the TX shunt transistor SH (TX) includes high voltage MISFETs and the number of serial connections of the MISFETs constituting the TX shunt transistor SH (TX) is reduced so as to suppress the nonuniformity of the voltage amplitude applied to each of the MISFETs coupled in series. Here, except for the TX shunt transistor SH (TX), low voltage MISFETs are used for the MISFET constituting the TX series transistor SE (TX), the RX series transistor SE (RX), and the RX shunt transistor SH (RX). This reason is described.

First, the reason why the RX series transistor SE (RX) includes five serially-coupled low voltage MISFETs is described. In FIG. 11, when a transmission signal is transmitted, the TX series transistor SH (TX) and the RX shunt transistor SH (RX) are on, and the RX series transistor SE (RX) and the TX shunt transistor SH (TX) are off. Accordingly, the same voltage amplitude will be applied to the RX series transistor SE (RX) that is off and the TX shunt transistor SH (TX) that is off. Therefore, if the nonuniformity of the voltage amplitudes is generated in the TX shunt transistor SH (TX), then the nonuniformity of the voltage amplitudes might be a problem also in the RX series transistor SE (RX).

However, in the RX series transistor SE (RX), the nonuniformity of the voltage amplitudes applied when the RX series transistor SE (RX) is off will not pose such a big problem as in the TX shunt transistor SH (TX). Namely, the RX series transistor SE (RX) has the function to be turned on when a reception signal is received, and to transmit the reception signal. From this, in order for the RX series transistor SE (RX) to reduce the loss of the reception signal, a reduction in the on-resistance is required for the MISFET constituting the RX series transistor SE (RX). Accordingly, in the RX series transistor SE (RX), the low voltage MISFET $Q_N$ having a small on-resistance is used, and the gate width of the low voltage MISFET $Q_N$ is increased in order to achieve a reduction in the on-resistance.

On the other hand, also in the TX shunt transistor SH (TX), the low voltage MISFET is used in the comparative example. However, in this case, since a transmission signal is not directly transmitted through the TX shunt transistor SH (TX), a reduction in the on-resistance is not required so much as in the RX series transistor SE (RX). Rather, a reduction in the on-resistance of the TX shunt transistor SH (TX) means an increase of the gate width, and if the gate width increases, the off capacitance increases. If the off capacitance increases, the leakage of a transmission signal will increase in the TX shunt transistor SH (TX). Accordingly, when a low voltage MISFET is used in the TX shunt transistor SH (TX) as with the comparative example, the gate width thereof is set smaller than that of the low voltage MISFET $Q_N$ used in the RX series transistor SE (RX). That is, even when the low voltage MISFET is used in both the RX series transistor SE (RX) and the TX shunt transistor SH (TX), the gate width of the low voltage MISFET $Q_N$ used in the RX series transistor SE (RX) is set larger than that of the low voltage MISFET used in the TX shunt transistor SH (TX).

In the RX series transistor SE (RX), since the gate width is large and the off capacitance is substantially proportional to the size of the gate width, the off capacitance of the low voltage MISFET $Q_N$ constituting the RX series transistor SE (RX) is larger than the off capacitance of the low voltage MISFET constituting the TX shunt transistor SH (TX). Specifically, the gate width of the low voltage MISFET $Q_N$ constituting the RX series transistor SE (RX) is about 10 times larger than that of the low voltage MISFET constituting the TX shunt transistor SH (TX). Accordingly, the off capacitance of the low voltage MISFET $Q_N$ constituting the RX series transistor SE (RX) is about 10 times larger than that of the low voltage MISFET constituting the TX shunt transistor SH (TX).

On the other hand, for the parasitic capacitance with respect to the ground, the percentage of the parasitic capacitance due to the gate resistance GR that is independent of the gate width is high. Therefore, there is not much difference in the parasitic capacitance with respect to the ground between the RX series transistor SE (RX) and the TX shunt transistor SH (TX). Accordingly, in the RX series transistor SE (RX), the percentage of the parasitic capacitance with respect to the off capacitance is higher than that in the TX shunt transistor SH (TX).

Here, as described in FIG. 7, if a total charge amount is designated by Q and the charge amount stored in the parasitic capacitance is designated by Qa, then for the charge amount to be stored in each off capacitance, the charge amount stored in an off capacitance decreases as the position of the off capacitance is closer to the ground because Qa is stored in each parasitic capacitance. As a result, the charge amount stored in each off capacitance will differ from each other and therefore the nonuniformity is generated in the voltage amplitudes applied to the respective off capacitances. Based on this mechanism, it is understood that the higher the percentage of the parasitic capacitance with respect to the off capacitance, the larger the nonuniformity of the voltage amplitude applied to each of the MISFETs coupled in series becomes. Accordingly, in the TX shunt transistor SH (TX), the percentage of the parasitic capacitance with respect to the off capacitance increases as compared with that in the RX series transistor SE (RX), and thus the nonuniformity of the voltage amplitudes becomes evident in the low voltage MISFET constituting the TX shunt transistor SH (TX). On the other hand, in the RX series transistor SE (RX), the percentage of the parasitic capacitance with respect to the off capacitance is low as compared with that in the TX shunt transistor SH (TX), and thus in the low voltage MISFET $Q_N$ constituting the RX series transistor SE (RX), the nonuniformity of the voltage amplitudes will not pose such a big problem.

Then, in the RX series transistor SE (RX), the low voltage MISFET $Q_N$ is used in view of reducing the on-resistance. That is, since the nonuniformity of the voltage amplitudes will not pose such a big problem in the RX series transistor SE (RX), it is less necessary that the RX series transistor SE (RX) includes high voltage MISFETs and the number of serial connections of the MISFETs constituting the RX series transistor SE (RX) is reduced. In contrast, if the RX series transistor SE (RX) includes high voltage MISFETs, the on-resistance will increase and the loss of the reception signal will increase.

Note that, since almost the same voltage amplitude as that applied to the TX shunt transistor SH (TX) that is off is applied to the RX series transistor SE (RX) that is off, the RX series transistor SE (RX) includes five low-voltage MISFETs $Q_N$ coupled in series in order to secure the breakdown voltage, on the assumption that the low voltage MISFET QN is used.

From the above, in the first embodiment, the TX shunt transistor SH (TX) includes three high-voltage MISFETs coupled in series, while the RX series transistor SE (RX) includes five low-voltage MISFETs coupled in series. In other words, the RX series transistor SE (RX) includes low voltage MISFETs, while the TX shunt transistor SH (TX) includes high voltage MISFETs whose breakdown voltage between the source region and the drain region is higher than that of the low voltage MISFET. Then, the number of high voltage MISFETs coupled in series between the transmission terminal and the GND terminal, the high voltage MISFETs constituting the TX shunt transistor SH (TX), is fewer than the number of low voltage MISFETs coupled in series between the reception terminal and the antenna terminal, the low voltage MISFETs constituting the RX series transistor SE (RX).

Subsequently, the reason why the TX series transistor SE (TX) also includes the low voltage MISFETs $Q_N$ as shown in FIG. 11 will be described. The TX series transistor SE (TX) has the function to be turned on when a transmission signal is transmitted, and to transmit the transmission signal. Therefore, in the TX series transistor SE (TX), in order to reduce the loss of the transmission signal, the low voltage MISFETs $Q_N$ having low on-resistances are used in the MISFETs constituting the TX series transistor SE (TX).

On the other hand, consider the case where the TX series transistor SE (TX) is off. The TX series transistor SE (TX) is turned off when a reception signal is received. At this time, the magnitude of voltage amplitude is not large as compared with that of the transmission signal because the power of the reception signal is weak. Therefore, in view of securing the breakdown voltage of the TX series transistor SE (TX), the number of serial connections of the low voltage MISFETs $Q_N$ may be fewer than that in the RX series transistor SE (RX). Indeed, in cases where a single-band high frequency signal is transmitted/received, since the TX series transistor SE (TX) is turned off at the time of reception and the power of the reception signal is small as compared with the transmission signal, there is no problem even if the number of serial connections of the low voltage MISFETs $Q_N$ constituting the TX series transistor SE (TX) is fewer than five. However, in cases where a dual-band high frequency signal is transmitted/received, a path through which a transmission signal of a first frequency band is transmitted and a path through which a transmission signal of a second frequency band is transmitted will be switched using the antenna switch ASW (see FIG. 2). In this case, for example, when a transmission signal of the second frequency band is transmitted, the TX series transistor SE (TX) for transmitting the transmission signal of the first frequency band needs to be turned off, and a voltage amplitude corresponding to the transmission signal with a high power will be applied to the TX series transistor SE (TX) that is off. For this reason, in the antenna switch ASW corresponding to the dual band, the breakdown voltage corresponding to the transmission signal needs to be secured also in the TX series transistor SE (TX), and therefore the TX series transistor SE (TX) includes, for example, five low-voltage MISFETs $Q_N$ coupled in series, as with the RX series transistor SE (RX).

Here, also in the TX series transistor SE (TX), the low voltage MISFETs $Q_N$ having small on-resistances are used, and the gate width of the low voltage MISFET $Q_N$ is increased in order to achieve a reduction in the on-resistance. Accordingly, in the TX series transistor SE (TX), since the percentage of the parasitic capacitance relative to the off capacitance is low as compared with the TX shunt transistor SH (TX) of the comparative example, the nonuniformity of the voltage amplitudes will not pose such a big problem also in the low voltage MISFETs $Q_N$ constituting the TX series transistor SE (TX).

Then, also in the TX series transistor SE (TX), the low voltage MISFET $Q_N$ is used in view of reducing the on-resistance. That is, since the nonuniformity of the voltage amplitudes will not pose such a big problem in the TX series transistor SE (TX), it is less necessary that the TX series transistor SE (TX) includes high voltage MISFETs and the number of serial connections of the MISFETs constituting the TX series transistor SE (TX) is reduced. In contrast, if the TX series transistor SE (TX) includes high voltage MISFETs, the on-resistance will increase, resulting in a loss of the transmission signal.

From the above, in the first embodiment, the TX shunt transistor SH (TX) includes three high-voltage MISFETs coupled in series, while the TX series transistor SE (TX) includes five low-voltage MISFETs coupled in series. In other words, the TX series transistor SE (TX) includes low voltage MISFETs, while the TX shunt transistor SH (TX) includes high voltage MISFETs whose breakdown voltage between the source region and the drain region is higher than that of the low voltage MISFET. Then, the number of high voltage MISFETs coupled in series between the transmission terminal and the GND terminal, the high voltage MISFETs constituting the TX shunt transistor SH (TX), is fewer than the number of low voltage MISFETs coupled in series between the reception terminal and the antenna terminal, the low voltage MISFETs constituting the TX series transistor SE (TX). Furthermore, both the TX series transistor SE (TX) and the RX series transistor SE (RX) include five low-voltage MISFETs coupled in series, for example.

Next, the reason why the RX shunt transistor SH (RX) includes the low voltage MISFETs $Q_N$ as shown in FIG. 11 will be described. The RX shunt transistor SH (RX) is turned on when a transmission signal is transmitted. This is because apart of the transmission signal leaking out to the reception terminal RX side via the off capacitance of the RX series transistor SE (RX), which is off at the time of transmission, is reflected efficiently. Namely, a part of the transmission signal having leaked out to the reception terminal RX side can be efficiently reflected by turning on the RX shunt transistor SH (RX) and thereby placing the path between the reception terminal RX and the GND terminal in a low impedance state. Therefore, in view of efficiently reflecting a part of a transmission signal, the on-resistance of the RX shunt transistor SH (RX) is preferably smaller. Then, in the first embodiment, the RX shunt transistor SH (RX) includes the low voltage MISFET $Q_N$.

On the other hand, the RX shunt transistor SH (RX) is turned off when a reception signal is received. However, the voltage amplitude applied to the RX shunt transistor SH (RX) that is off is the voltage amplitude corresponding to the reception signal having a weak power. For this reason, the breakdown voltage can be sufficiently secured even if the RX shunt transistor SH (RX) includes one low voltage MISFET $Q_N$. As stated above, in the first embodiment, since the RX shunt transistor SH (RX) includes one low voltage MISFET $Q_N$, the nonuniformity of the voltage amplitude in the RX shunt transistor SH (RX) is not a problem.

From the above, in the first embodiment, the TX shunt transistor SH (TX) includes three high-voltage MISFETs coupled in series while the RX shunt transistor SH (RX) includes one low voltage MISFET.

<Configuration of Mounting the Antenna Switch in the First Embodiment>

Figure 14:
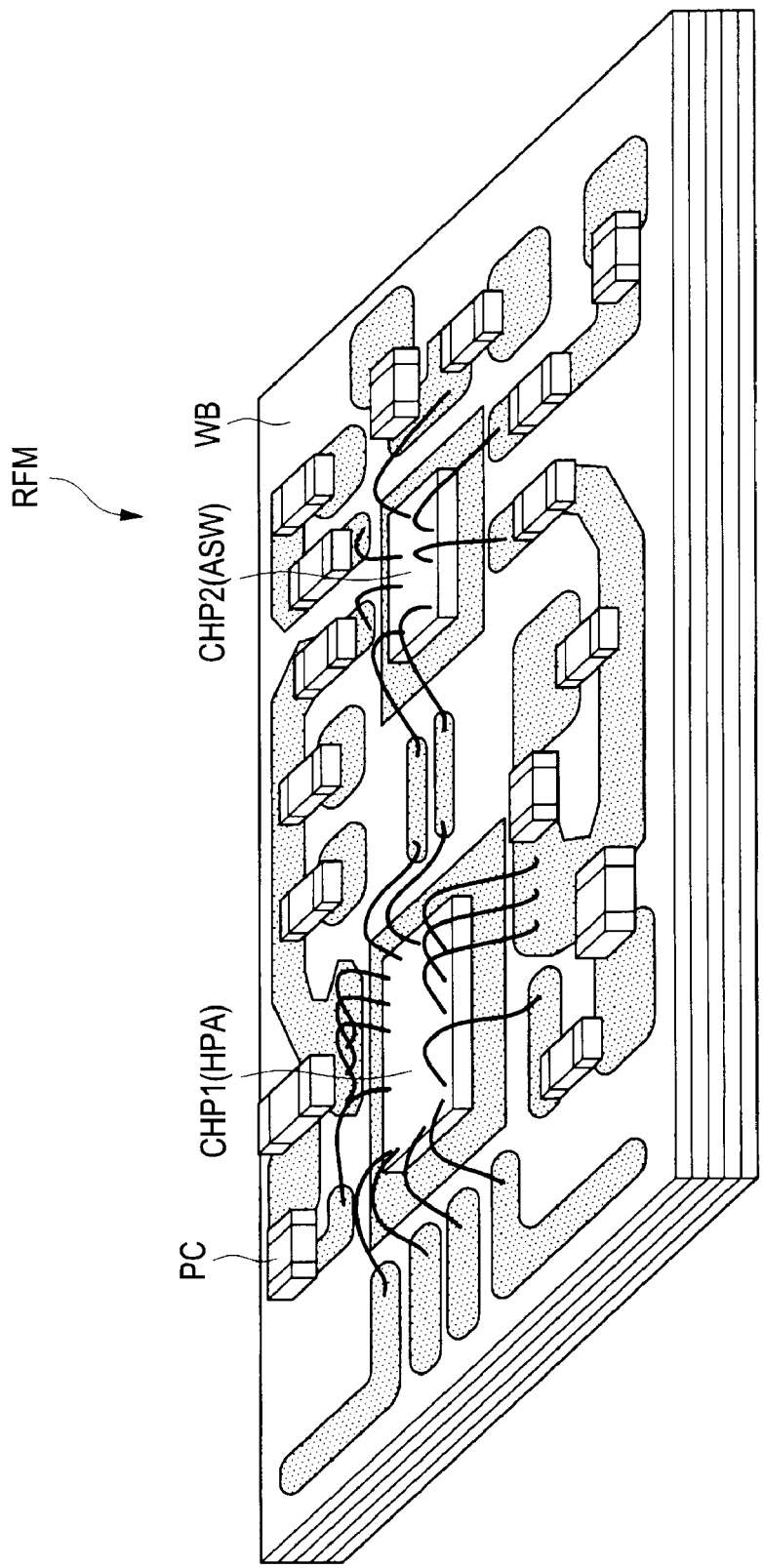
FIG. 14 is a perspective view showing a configuration of mounting an RF module in the first embodiment.

Next, a configuration of mounting the antenna switch ASW in the first embodiment will be described. The antenna switch ASW in the first embodiment together with the power amplifier HPA constitutes one RF module RFM. FIG. 14 is a perspective view showing the configuration of mounting the RF module RFM in the present embodiment. As shown in FIG. 14, in the RF module RFM in the present embodiment, a semiconductor chip CHP1, a semiconductor chip CHP2, and passive components PC are mounted over a wiring board WB. The semiconductor chip CHP1 is a semiconductor chip in which, for example, an LDMOSFET (Laterally Diffused Metal Oxide Semiconductor Field Effect Transistor: Laterally Diffused MOSFET) constituting the power amplifier HPA and the like are formed. On the other hand, the semiconductor chip CHP2 is a semiconductor chip in which, for example, MOSFETs constituting the antenna switch ASW and the like are formed. The passive component PC includes passive elements, such as a resistive element (e.g., chip resistor), a capacitive element (e.g., chip capacitor), or an inductive element (e.g., chip inductor), and includes chip parts, for example. The passive component 5 is, for example, a passive component constituting a matching circuit and the like.

The semiconductor chip CHP1 mounted over the wiring board WB is coupled to a conductor pattern formed over the wiring board WB with wires. Furthermore, this conductor pattern is coupled to the passive component PC. Similarly, the semiconductor chip CHP2 mounted over the wiring board WB is coupled to a conductor pattern formed over the wiring board WB with wires. In this manner, the semiconductor chip CHP1, the semiconductor chip CHP2, and the passive components PC will be electrically coupled to each other via the conductor pattern.

<Layout Configuration of a Semiconductor Chip Having the Antenna Switch Formed Therein>

Figure 15:
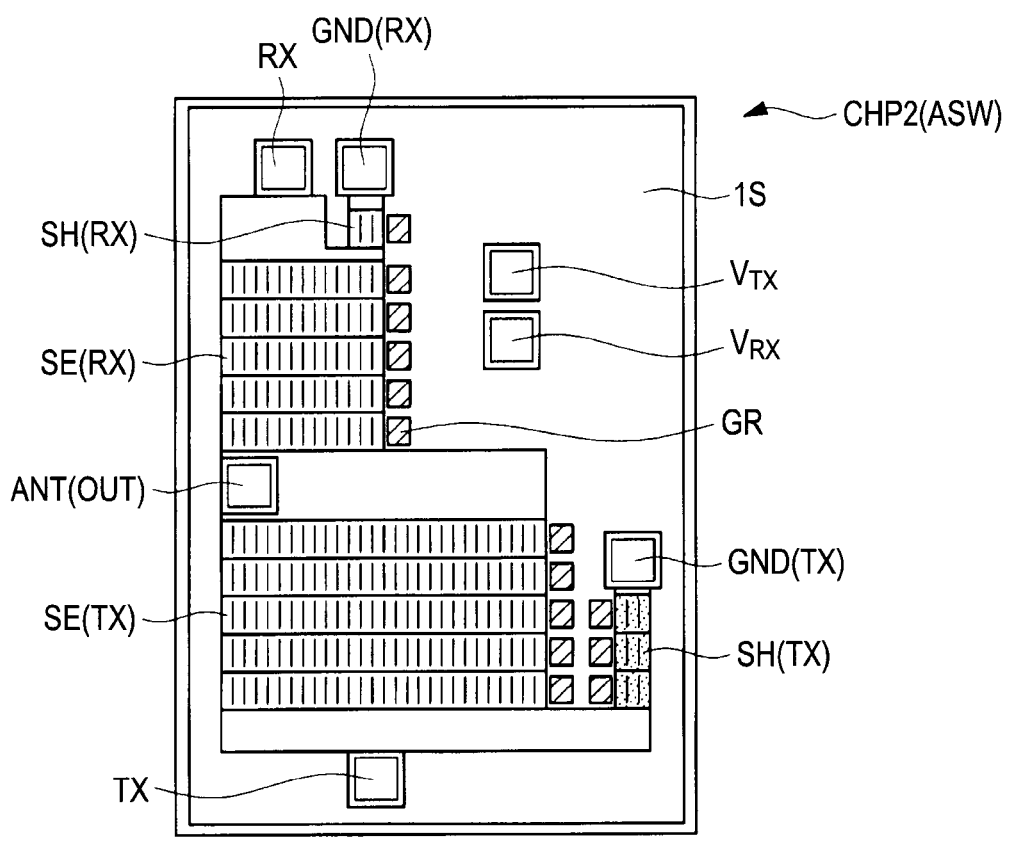
FIG. 15 shows a layout configuration of a semiconductor chip constituting the antenna switch in the first embodiment.

Subsequently, a layout configuration of the semiconductor chip CHP2 having the antenna switch formed therein will be described. FIG. 15 is a plan view showing the semiconductor chip CHP2 forming the antenna switch ASW in the first embodiment. As shown in FIG. 15, in the semiconductor chip CHP2, a plurality of terminals and a plurality of elements are formed over a rectangular semiconductor substrate 1S. Specifically, in FIG. 15, on the upper part of the semiconductor substrate 1S there are formed the reception terminal RX and the GND terminal GND (RX), and on the lower side of the GND terminal GND (RX) there is formed the RX shunt transistor SH (RX) including one low voltage MISFET. On the lower side of the RX shunt transistor SH (RX) there is formed the RX series transistor SE (RX) including five low-voltage MISFETs. Then, on the right side of the RX shunt transistor SH (RX) and RX series transistor SE (RX) there is formed the gate resistance GR, and on the further right side of the gate resistance GR there are formed the control terminal $V_{Tx}$ and the control terminal $V_{RX}$.

On the lower side of the RX series transistor SE (RX) there is formed the antenna terminal ANT (OUT), and on the lower side of the antenna terminal ANT (OUT) there is formed the TX series transistor SE (TX) including five low-voltage MISFETs. Furthermore, on the lower side of the TX series transistor SE (TX) there is formed the transmission terminal TX, and on the right side of the TX series transistor SE (TX) there is formed the TX shunt transistor SH (TX) via the gate resistance GR. The TX shunt transistor SH (TX) includes three high-voltage MISFETs, and on the upper part of the TX shunt transistor SH (TX) there is formed the GND terminal GND (TX).

Figure 16:
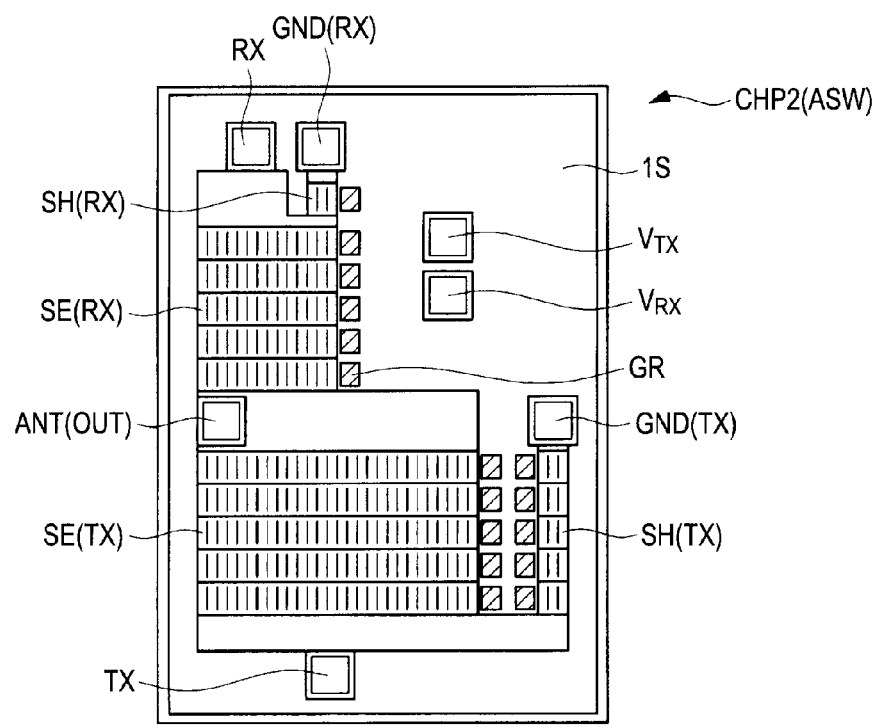
FIG. 16 shows a layout configuration of a semiconductor chip constituting the antenna switch in a comparative example.

On the other hand, FIG. 16 is a plan view showing the semiconductor chip CHP2 forming the antenna switch ASW in the comparative example. Although the comparative example shown in FIG. 16 has almost the same layout configuration as that of the first embodiment shown in FIG. 15, the configuration of the TX shunt transistor SH (TX) differs from that of the first embodiment. That is, in the comparative example shown in FIG. 16, the TX shunt transistor SH (TX) includes five low-voltage MISFETs, while in the first embodiment shown in FIG. 15, the TX shunt transistor SH (TX) includes three high-voltage MISFETs. Thus, in the first embodiment shown in FIG. 15, the layout area of the TX shunt transistor SH (TX) is reduced and consequently an effect of shrinking the entire area of the semiconductor chip CHP2 is also obtained.

<Device Configuration of the Antenna Switch>

The antenna switch is required to have performance to secure high quality in high-power transmission signals and also reduce the generation of interfering waves (high order harmonics) adversely affecting the communications in other frequency band. For this reason, when a field effect transistor is used as the switching element constituting the antenna switch, this field effect transistor is required to have not only high-voltage resistance but performance that can reduce higher order harmonic distortion.

For this reason, for the field effect transistor constituting the antenna switch, a field effect transistor (e.g., HEMT (High Electron Mobility Transistor)) formed over a GaAs substrate or sapphire substrate having a small parasitic capacitance and being excellent in linearity is used in order to achieve low loss and low harmonic distortion. However, a compound semiconductor substrate excellent in high frequency characteristics is expensive, and is not preferable in view of reducing the cost of the antenna switch. In order to achieve a cost reduction of the antenna switch, it is effective to use a field effect transistor formed over an inexpensive silicon substrate. However, the inexpensive silicon substrate has a large parasitic capacitance as compared with the expensive compound semiconductor substrate and has a harmonic distortion higher than a field effect transistor formed over the compound semiconductor substrate.

Then, in the first embodiment, in view of achieving a cost reduction of the antenna switch, the description is made in particular on the assumption that the harmonic distortion generated in an antenna switch can be reduced as much as possible even when the antenna switch includes field effect transistors formed over a silicon substrate. Specifically, in the first embodiment, an example is described, in which a low voltage MISFET and a high voltage MISFET are formed over an SOI (silicon on insulator) substrate. In the first embodiment, the low voltage MISFET is applied to the TX series transistor SE (TX), the RX series transistor SE (RX), and the RX shunt transistor SH (RX), respectively, while the high voltage MISFET is applied to the TX shunt transistor SH (TX).

Figure 17:
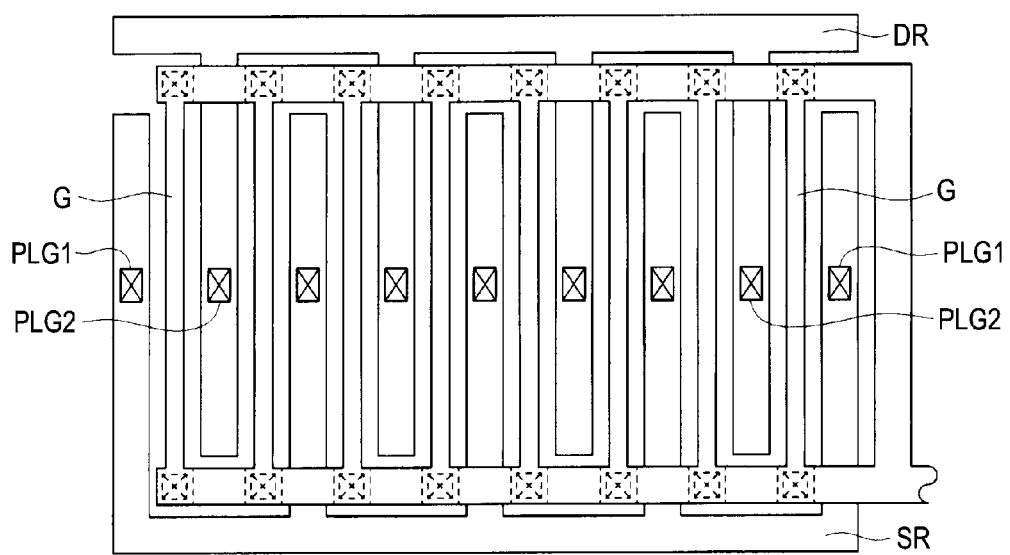
FIG. 17 is a plan view showing a device configuration of MISFETs constituting the antenna switch in the first embodiment.

FIG. 17 is a plan view showing a device configuration of the low voltage MISFET and high voltage MISFET in the first embodiment. In FIG. 17, the planar structures of the low voltage MISFET and high voltage MISFET are similar to each other. The low voltage MISFET and the high voltage MISFET have the source region SR and the drain region DR, respectively, wherein the source region SR and the drain region DR are alternately positioned. Then, the gate electrode G is formed between the source region SR and the drain region DR. A plug PLG1 is coupled to the source region SR, and a plug PLG2 is coupled to the drain region DR.

Figure 18:
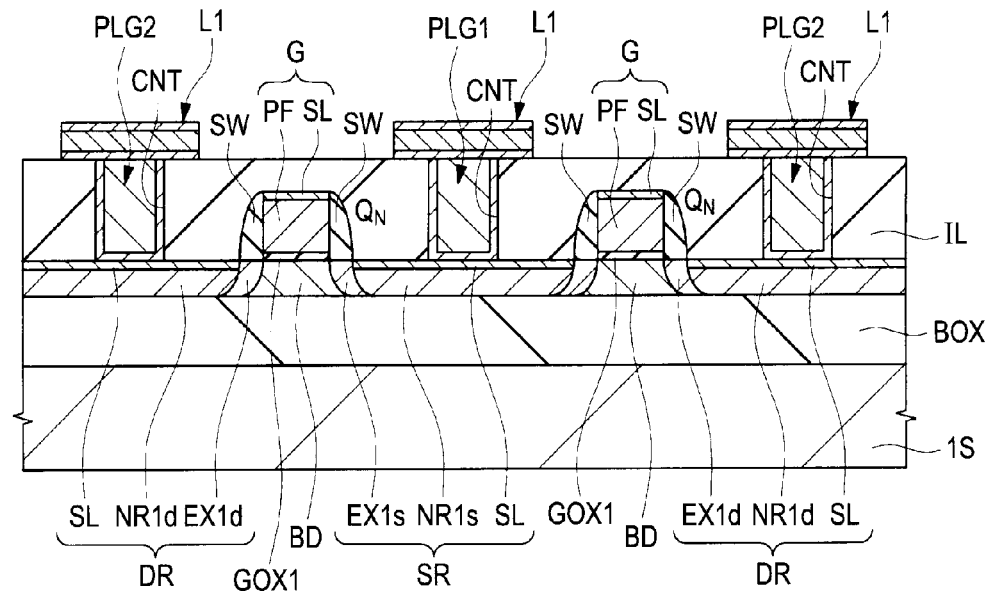
FIG. 18 is a cross sectional view showing a device structure of a low voltage MISFET constituting the antenna switch in the first embodiment.

Next, a cross-sectional structure of the low voltage MISFET $Q_N$ will be described. FIG. 18 is a cross sectional view showing the cross section of the low voltage MISFET $Q_N$. In FIG. 18, an embedded insulating layer BOX is formed over the semiconductor substrate 1S, and a silicon layer is formed over the embedded insulating layer BOX. An SOI substrate is formed from the semiconductor substrate 1S, the embedded insulating layer BOX, and the silicon layer. Then, the low voltage MISFET $Q_N$ is formed over this SOI substrate. A body region BD is formed in the silicon layer of the SOI substrate. The body region BD is formed, for example, from a p-type semiconductor region into which boron that is a p-type impurity is introduced. A gate insulating film GOX1 is formed over the body region BD, and the gate electrode G is formed over the gate insulating film GOX1. The gate insulating film GOX1 is formed from a silicon oxide film, for example. On the other hand, the gate electrode G is formed from a laminated film of a polysilicon film PF and a cobalt silicide film SL. The cobalt silicide film SL constituting a part of the gate electrode G is formed for reducing the resistance of the gate electrode G.

Subsequently, a sidewall SW is formed in a side wall on both sides of the gate electrode G, and low concentration impurity diffusion regions EX1s, EX1d are formed in the silicon layer that is a lower layer of the sidewall SW. These low concentration impurity diffusion regions EX1s, EX1d are formed in alignment with the gate electrode G. Then, a high concentration impurity diffusion region NR1s is formed on the outer side of the low concentration impurity diffusion region EX1s, and a high concentration impurity diffusion region NR1d is formed on the outer side of the low concentration impurity diffusion region EX1d. The high concentration impurity diffusion regions NR1s, NR1d are formed in alignment with the sidewall SW. Furthermore, the cobalt silicide film SL is formed in the surfaces of the high concentration impurity diffusion regions NR1s, NR1d. The source region SR is formed from the low concentration impurity diffusion region EX1s, the high concentration impurity diffusion region NR1s, and the cobalt silicide film SL, while the drain region DR is formed from the low concentration impurity diffusion region EX1$d$, the high concentration impurity diffusion region NR1$d$, and the cobalt silicide film SL.

The low concentration impurity diffusion regions EX1$s$, EX1$d$ and the high concentration impurity diffusion regions NR1$s$, NR1$d$ are both semiconductor regions into which an n-type impurity, such as phosphorus or arsenic, is introduced, wherein the concentration of the impurity introduced into the low concentration impurity diffusion regions EX1$s$, EX1$d$ is lower than the concentration of the impurity introduced into the high concentration impurity diffusion regions NR1$s$, NR1$d$. Specifically, in the low voltage MISFET $Q_N$ in the first embodiment, the concentration of the impurity introduced into the low concentration impurity diffusion regions EX1$s$, EX1$d$ is approximately $1 \times 10^{18}$ cm$^{-3}$. As a result, the breakdown voltage between the source region SR and the drain region DR of the low voltage MISFET $Q_N$ in the first embodiment is approximately 4 V.

The low voltage MISFET $Q_N$ in the first embodiment is configured as described above, and now the wiring structure formed over the low voltage MISFET $Q_N$ is described. In FIG. 18, an interlayer insulating film IL is formed so as to cover the low voltage MISFET $Q_N$ in the first embodiment. The interlayer insulating film IL is formed from a silicon oxide film, for example. Then, a contact hole CNT reaching the source region SR and a contact hole CNT reaching the drain region DR are formed in the interlayer insulating film IL. Then, a titanium/titanium nitride film and a tungsten film are embedded into the contact holes CNT to form plugs PLG1, PLG2. A wiring L1 is formed over the interlayer insulating film IL in which the plug PLG1 and the plug PLG2 are formed. For example, the wiring L1 is formed from a laminated film of a titanium/titanium nitride film, an aluminum film, and a titanium/titanium nitride film. Furthermore, a multilayer wiring is formed over the wiring L1, but this is omitted in FIG. 18.

Figure 19:
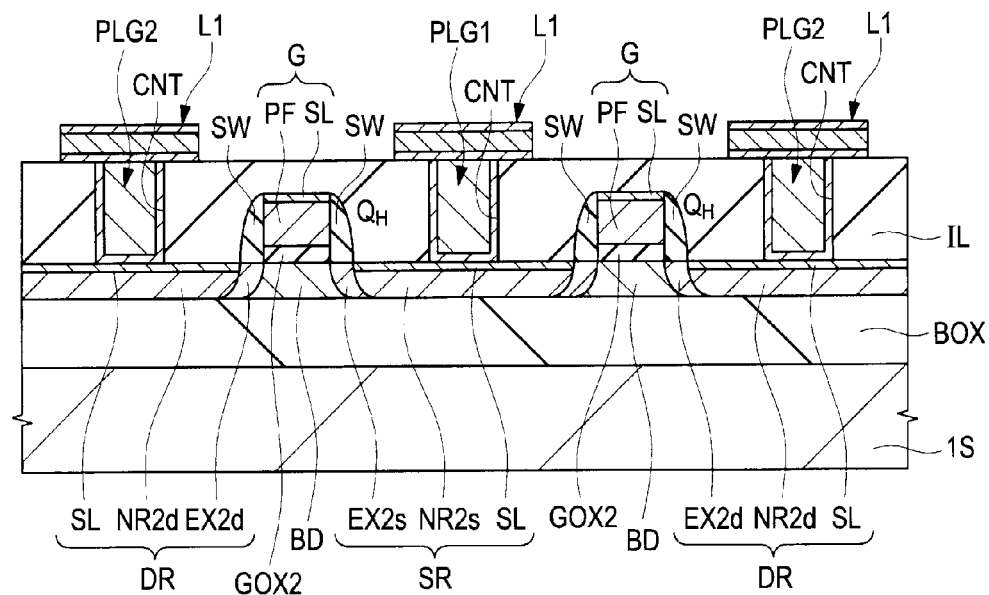
FIG. 19 is a cross sectional view showing a device structure of a high voltage MISFET constituting the antenna switch in the first embodiment.

Next, a cross-sectional structure of the high voltage MISFET $Q_H$ will be described. FIG. 19 is a cross sectional view showing the cross section of the high voltage MISFET $Q_H$. In FIG. 19, the embedded insulating layer BOX is formed over the semiconductor substrate 1S, and a silicon layer is formed over the embedded insulating layer BOX. The SOI substrate is formed from the semiconductor substrate 1S, the embedded insulating layer BOX, and the silicon layer. Then, the high voltage MISFET $Q_H$ is formed over this SOI substrate. The body region BD is formed in the silicon layer of the SOI substrate. The body region BD is formed, for example, from a p-type semiconductor region into which boron that is a p-type impurity is introduced. A gate insulating film GOX2 is formed over the body region BD, and the gate electrode G is formed over the gate insulating film GOX2. The gate insulating film GOX2 is formed from a silicon oxide film, for example, and is thicker than the gate insulating film GOX1 of the low voltage MISFET $Q_N$. On the other hand, the gate electrode G is formed from a laminated film of the polysilicon film PF and the cobalt silicide film SL. The cobalt silicide film SL constituting a part of the gate electrode G is formed for reducing the resistance of the gate electrode G.

Subsequently, the sidewall SW is formed in a side wall on both sides of the gate electrode G, and low concentration impurity diffusion regions EX2$s$, EX2$d$ are formed in the silicon layer that is a lower layer of the sidewall SW. These low concentration impurity diffusion regions EX2$s$, EX2$d$ are formed in alignment with the gate electrode G. Then, a high concentration impurity diffusion region NR2$s$ is formed on the outer side of the low concentration impurity diffusion region EX2$s$, and a high concentration impurity diffusion region NR2$d$ is formed on the outer side of the low concentration impurity diffusion region EX2$d$. The high concentration impurity diffusion regions NR2$s$, NR2$d$ are formed in alignment with the sidewall SW. Furthermore, the cobalt silicide film SL is formed in the surfaces of the high concentration impurity diffusion regions NR2$s$, NR2$d$. The source region SR is formed from the low concentration impurity diffusion region EX2$s$, the high concentration impurity diffusion region NR2$s$, and the cobalt silicide film SL, while the drain region DR is formed from the low concentration impurity diffusion region EX2$d$, the high concentration impurity diffusion region NR2$d$, and the cobalt silicide film SL.

The low concentration impurity diffusion regions EX2$s$, EX2$d$ and the high concentration impurity diffusion regions NR2$s$, NR2$d$ are semiconductor regions into which an n-type impurity, such as phosphorus or arsenic, is introduced, and the concentration of the impurity introduced into the low concentration impurity diffusion regions EX2$s$, EX2$d$ is lower than the concentration of the impurity introduced into the high concentration impurity diffusion regions NR2$s$, NR2$d$. Specifically, in the high voltage MISFET $Q_H$ in the first embodiment, the concentration of the impurity introduced into the low concentration impurity diffusion regions EX2$s$, EX2$d$ is approximately $3 \times 10^{17}$ cm$^{-3}$. Therefore, this concentration is lower than the concentration of the impurity, which is approximately $1 \times 10^{18}$ cm$^{-3}$, introduced into the low concentration impurity diffusion regions EX1$s$, EX1$d$ of the low voltage MISFET $Q_N$ described above. Thus, in the high voltage MISFET $Q_H$ in the first embodiment, the breakdown voltage can be improved by setting the concentration of the impurity introduced into the low concentration impurity diffusion regions EX2$s$, EX2$d$ lower than the concentration of the impurity introduced into the low concentration impurity diffusion regions EX1$s$, EX1$d$ of low voltage MISFET $Q_N$. This results from the fact that the impurity concentration of the low concentration impurity diffusion regions EX2$s$, EX2$d$ constituting a part of the source region SR and a part of the drain region DR is set low and thereby a depletion layer, which is generated in a boundary between the drain region DR and the body region BD when a voltage is applied between the source region SR and the drain region DR, extends to the drain region DR side (low-concentration impurity diffusion region EX2$d$ side). Thus, electric field concentration in the vicinity of the boundary between the drain region DR and the body region BD is relaxed. As a result, with the high voltage MISFET $Q_H$ in the first embodiment, the breakdown voltage between the source region SR and the drain region DR can be set to approximately 6 V.

The high voltage MISFET $Q_H$ in the first embodiment is configured as described above, and now the wiring structure formed over the high voltage MISFET $Q_H$ is described. In FIG. 19, the interlayer insulating film IL is formed so as to cover the high voltage MISFET $Q_H$ in the first embodiment. The interlayer insulating film IL is formed from a silicon oxide film, for example. Then, the contact hole CNT reaching the source region SR and the contact hole CNT reaching the drain region DR are formed in the interlayer insulating film IL. Then, a titanium/titanium nitride film and a tungsten film are embedded into the contact holes CNT to form the plugs PLG1, PLG2. The wiring L1 is formed over the interlayer insulating film IL in which the plug PLG1 and the plug PLG2 are formed. For example, the wiring L1 is formed from a laminated film of a titanium/titanium nitride film, an aluminum film, and a titanium/titanium nitride film. Furthermore, a multilayer wiring is formed over the wiring L1, but this is omitted in FIG. 19.

In this manner, the low voltage MISFET $Q_N$ and the high voltage MISFET $Q_H$ in the first embodiment can be formed.

The low voltage MISFET $Q_N$ in the first embodiment is applied to the TX series transistor SE (TX), the RX series transistor SE (RX), and the RX shunt transistor SH (RX), while the high voltage MISFET $Q_H$ in the first embodiment is applied to the TX shunt transistor SH (TX). As a result, the number of serial connections of the TX shunt transistor SH (TX) can be reduced, and an antenna switch having low loss and low harmonic distortion can be realized. Specifically, for example, as compared with the comparative example (the low voltage MISFET is used in the TX shunt transistor SH (TX)), the second harmonic distortion and the third harmonic distortion at the frequency of 0.9 GHz and the input power of 35 dB can be reduced by 5 dB, respectively, in the first embodiment.

Second Embodiment

Figure 20:
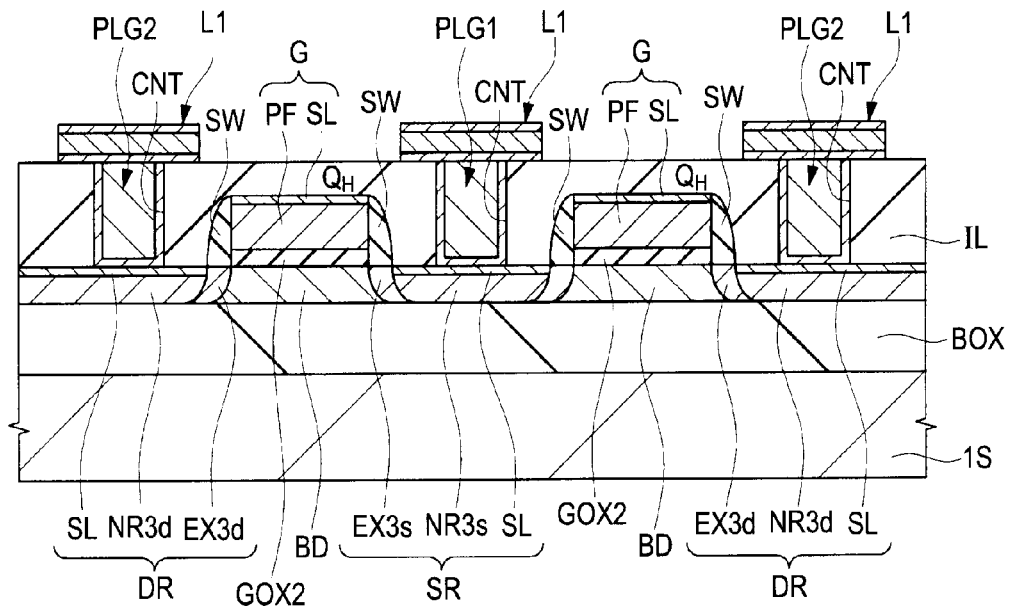
FIG. 20 is a cross sectional view showing a device structure of a high voltage MISFET constituting an antenna switch in a second embodiment.

In a second embodiment of the present invention, a device structure of another aspect of the high voltage MISFET $Q_H$ will be described. FIG. 20 is a cross sectional view showing the cross section of the high voltage MISFET $Q_H$. In FIG. 20, an embedded insulating layer BOX is formed over a semiconductor substrate 1S, and a silicon layer is formed over the embedded insulating layer BOX. The SOI substrate is formed from the semiconductor substrate 1S, the embedded insulating layer BOX, and the silicon layer. Then, the high voltage MISFET $Q_H$ is formed over this SOI substrate. A body region BD is formed in the silicon layer of the SOI substrate. The body region BD is formed, for example, from a p-type semiconductor region into which boron that is a p-type impurity is introduced. A gate insulating film GOX2 is formed over the body region BD, and a gate electrode G is formed over the gate insulating film GOX2. The gate insulating film GOX2 is formed from a silicon oxide film, for example, and is thicker than a gate insulating film GOX1 of the low voltage MISFET $Q_N$. On the other hand, the gate electrode G is formed from a laminated film of a polysilicon film PF and a cobalt silicide film SL. The cobalt silicide film SL constituting a part of the gate electrode G is formed for reducing the resistance of the gate electrode G.

Next, a sidewall SW is formed in a side wall on both sides of the gate electrode G, and low concentration impurity diffusion regions EX3s, EX3d are formed in the silicon layer that is a lower layer of the sidewall SW. These low concentration impurity diffusion regions EX3s, EX3d are formed in alignment with the gate electrode G. Then, a high concentration impurity diffusion region NR3s is formed on the outer side of the low concentration impurity diffusion region EX3s, and a high concentration impurity diffusion region NR3d is formed on the outer side of the low concentration impurity diffusion region EX3d. The high concentration impurity diffusion regions NR3s, NR3d are formed in alignment with the sidewall SW. Furthermore, the cobalt silicide film SL is formed in the surfaces of the high concentration impurity diffusion regions NR3s, NR3d. The source region SR is formed from the low concentration impurity diffusion region EX3s, the high concentration impurity diffusion region NR3s, and the cobalt silicide film SL, while the drain region DR is formed from the low concentration impurity diffusion region EX3d, the high concentration impurity diffusion region NR3d, and the cobalt silicide film SL.

The low concentration impurity diffusion regions EX3s, EX3d and the high concentration impurity diffusion regions NR3s, NR3d are semiconductor regions into which an n-type impurity, such as phosphorus or arsenic, is introduced, and the concentration of the impurity introduced into the low concentration impurity diffusion regions EX3s, EX3d is lower than the concentration of the impurity introduced into the high concentration impurity diffusion regions NR3s, NR3d.

The high voltage MISFET $Q_H$ in the second embodiment is characterized in that the length in the gate length direction (direction in which a channel is formed) of the gate electrode G is longer than the length in the gate length direction of the low voltage MISFET. Specifically, the gate length of the high voltage MISFET $Q_H$ in the second embodiment is approximately 1 μm while the gate length of the low voltage MISFET is approximately 0.5 μm. That is, the gate length of the high voltage MISFET $Q_H$ is approximately twice that of the low voltage MISFET.

In the high voltage MISFET $Q_H$, applying a voltage between the drain region DR and the source region SR will generate a depletion layer in the boundary between the drain region DR and the body region BD. The greater the voltage applied between the drain region DR and the source region SR, the further this depletion layer extends. Then, if the depletion layer extends through the inside of the body region BD and reaches the source region SR, then a punch through occurs. However, in the high voltage MISFET $Q_H$ in the second embodiment, the gate length of the gate electrode G is increased. This, in other words, means that the width of the body region BD will increase. Accordingly, there is more room for the depletion layer to extend inside the body region BD, and thus, in order for the depletion layer to extend through the body region BD and reach the source region SR, the voltage applied between the source region SR and the drain region DR should be increased considerably. This means that the breakdown voltage of the high voltage MISFET $Q_H$ (breakdown voltage between the source region SR and the drain region DR) has been improved. From the above, according to the second embodiment, the high voltage MISFET $Q_H$ having an improved breakdown voltage of approximately 6 V can be obtained.

The high voltage MISFET $Q_H$ in the second embodiment is configured as described above, and now the wiring structure formed over the high voltage MISFET $Q_H$ is described. In FIG. 20, the interlayer insulating film IL is formed so as to cover the high voltage MISFET $Q_H$ in the second embodiment. The interlayer insulating film IL is formed from a silicon oxide film, for example. Then, the contact hole CNT reaching the source region SR and the contact hole CNT reaching the drain region DR are formed in the interlayer insulating film IL. Then, a titanium/titanium nitride film and a tungsten film are embedded into the contact holes CNT to form the plugs PLG1, PLG2. The wiring L1 is formed over the interlayer insulating film IL in which the plug PLG1 and the plug PLG2 are formed. For example, the wiring L1 is formed from a laminated film of a titanium/titanium nitride film, an aluminum film, and a titanium/titanium nitride film. Furthermore, a multilayer wiring is formed over the wiring L1, but this is omitted in FIG. 20.

In this manner, the high voltage MISFET $Q_H$ in the second embodiment can be formed. The low voltage MISFET is applied to the TX series transistor SE (TX), the RX series transistor SE (RX), and the RX shunt transistor SH (RX), while the high voltage MISFET $Q_H$ in the second embodiment is applied to the TX shunt transistor SH (TX). As a result, the number of serial connections of the TX shunt transistor SH (TX) can be reduced, and an antenna switch having low loss and low harmonic distortion can be realized. Specifically, for example, as compared with the comparative example (configuration of using the low voltage MISFET in the TX shunt transistor SH (TX)), the second harmonic distortion and the third harmonic distortion at the frequency of 0.9 GHz and the input power of 35 dB can be reduced by 5 dB, respectively, in the second embodiment.

Third Embodiment

In a third embodiment of the present invention, an example is described, in which a fully-depleted FET is used as the low voltage MISFET $Q_N$ and a partially-depleted FET is used as the high voltage MISFET $Q_H$.

Figure 21:
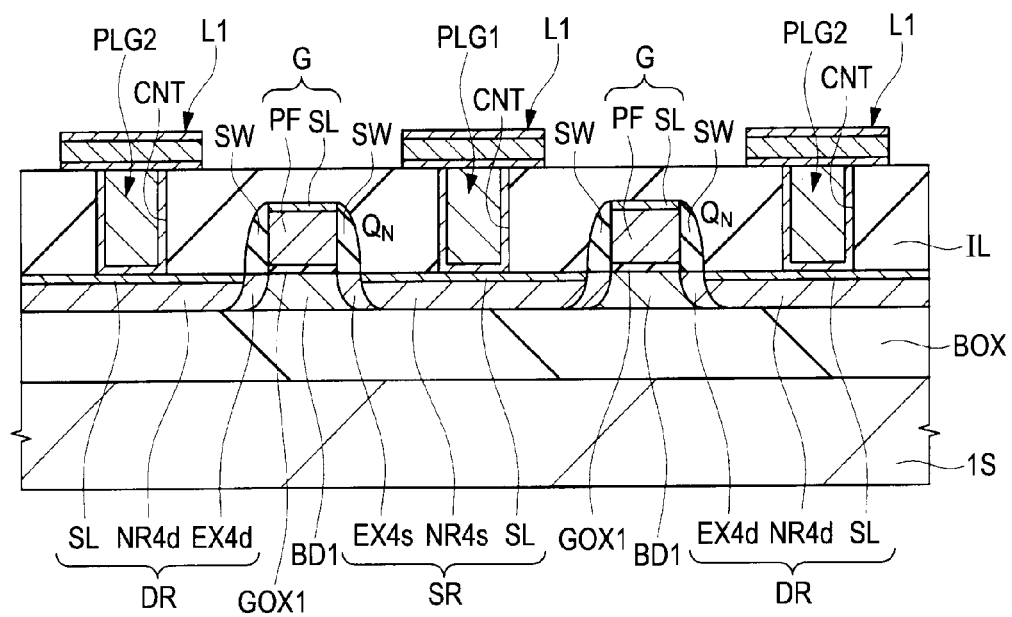
FIG. 21 is a cross sectional view showing a device structure of a low voltage MISFET constituting an antenna switch in a third embodiment.

First, a cross-sectional structure of the low voltage MISFET $Q_N$ is described. FIG. 21 is a cross sectional view showing the cross section of the low voltage MISFET $Q_N$. In FIG. 21, the embedded insulating layer BOX is formed over the semiconductor substrate 1S, and a silicon layer is formed over the embedded insulating layer BOX. The SOI substrate is formed from the semiconductor substrate 1S, the embedded insulating layer BOX, and the silicon layer. Then, the low voltage MISFET $Q_N$ is formed over this SOI substrate. A body region BD1 is formed in the silicon layer of the SOI substrate. The body region BD1 is formed, for example, from a p-type semiconductor region into which boron that is a p-type impurity is introduced. The gate insulating film GOX1 is formed over the body region BD1, and the gate electrode G is formed over the gate insulating film GOX1. The gate insulating film GOX1 is formed from a silicon oxide film, for example. On the other hand, the gate electrode G is formed from a laminated film of the polysilicon film PF and the cobalt silicide film SL. The cobalt silicide film SL constituting a part of the gate electrode G is formed for reducing the resistance of the gate electrode G.

Subsequently, the sidewall SW is formed in a side wall on both sides of the gate electrode G, and low concentration impurity diffusion regions EX4s, EX4d are formed in the silicon layer that is a lower layer of the sidewall SW. These low concentration impurity diffusion regions EX4s, EX4d are formed in alignment with the gate electrode G. Then, a high concentration impurity diffusion region NR4s is formed on the outer side of the low concentration impurity diffusion region EX4s, and a high concentration impurity diffusion region NR4d is formed on the outer side of the low concentration impurity diffusion region EX4d. The high concentration impurity diffusion regions NR4s, NR4d are formed in alignment with the sidewall SW. Furthermore, the cobalt silicide film SL is formed in the surfaces of the high concentration impurity diffusion regions NR4s, NR4d. The source region SR is formed from the low concentration impurity diffusion region EX4s, the high concentration impurity diffusion region NR4s, and the cobalt silicide film SL, while the drain region DR is formed from the low concentration impurity diffusion region EX4d, the high concentration impurity diffusion region NR4d, and the cobalt silicide film SL.

The low concentration impurity diffusion regions EX4s, EX4d and the high concentration impurity diffusion regions NR4s, NR4d are semiconductor regions into which an n-type impurity, such as phosphorus or arsenic, is introduced, and the concentration of the impurity introduced into the low concentration impurity diffusion regions EX4s, EX4d is lower than the concentration of the impurity introduced into the high concentration impurity diffusion regions NR4s, NR4d.

The low voltage MISFET $Q_N$ in the third embodiment is characterized in that the body region BD1 is fully depleted. That is, even during operation of the low voltage MISFET $Q_N$, the whole body region BD1 is fully depleted due to a work function value of the gate electrode G and a voltage value applied to the gate electrode. Such a fully depleted state of the body region BD1 can be realized by reducing the impurity concentration of the body region BD1. Specifically, in the third embodiment, the impurity concentration of the body region BD1 is set to approximately $2 \times 10^{17}$ cm$^{-3}$. By configuring the low voltage MISFET $Q_N$ from the fully-depleted FET in this manner, the electrical characteristics of the low voltage MISFET $Q_N$ can be improved. For example, in the fully-depleted FET, the impurity concentration of the body region BD1 is low. For this reason, although a channel is formed in the body region BD1 when the low voltage MISFET $Q_N$ is turned on, the resistance of this channel can be reduced. This means the on-resistance of the low voltage MISFET $Q_N$ can be reduced. Accordingly, use of the fully-depleted FET as the low voltage MISFET $Q_N$ can achieve an improved property, i.e., a reduction in the on-resistance, for example.

The low voltage MISFET $Q_N$ in the third embodiment is configured as described above, and now the wiring structure formed over the low voltage MISFET $Q_N$ is described. In FIG. 21, the interlayer insulating film IL is formed so as to cover the low voltage MISFET $Q_N$ in the third embodiment. The interlayer insulating film IL is formed from a silicon oxide film, for example. Then, the contact hole CNT reaching the source region SR and the contact hole CNT reaching the drain region DR are formed in the interlayer insulating film IL. Then, a titanium/titanium nitride film and a tungsten film are embedded into the contact holes CNT to form the plugs PLG1, PLG2. The wiring L1 is formed over the interlayer insulating film IL in which the plug PLG1 and the plug PLG2 are formed. For example, the wiring L1 is formed from a laminated film of a titanium/titanium nitride film, an aluminum film, and a titanium/titanium nitride film. Furthermore, a multilayer wiring is formed over the wiring L1, but this is omitted in FIG. 21.

Figure 22:
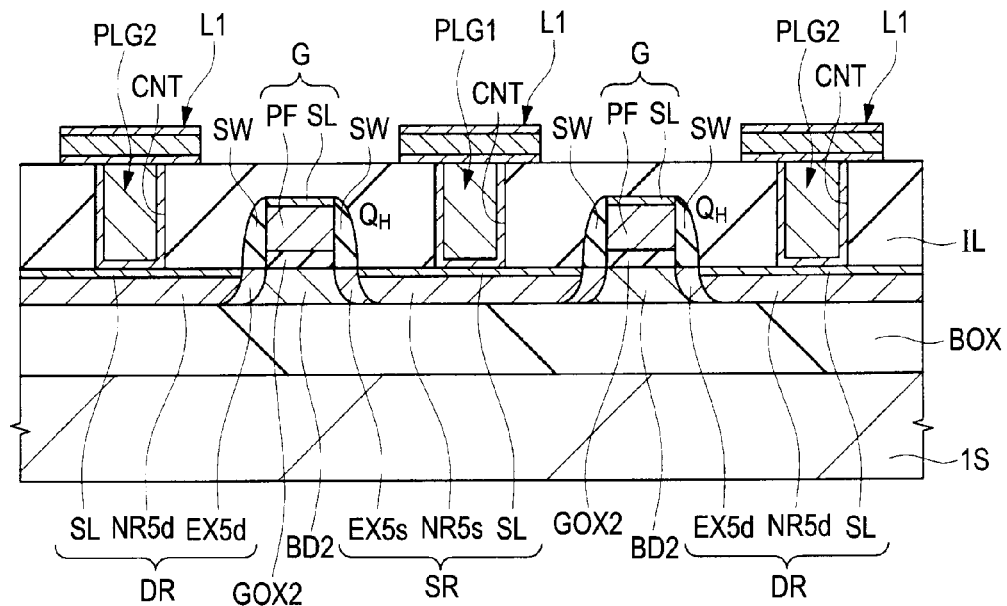
FIG. 22 is a cross sectional view showing a device structure of a high voltage MISFET constituting the antenna switch in the third embodiment.

Next, a cross-sectional structure of the high voltage MISFET $Q_H$ will be described. FIG. 22 is a cross sectional view showing the cross section of the high voltage MISFET $Q_H$. In FIG. 22, the embedded insulating layer BOX is formed over the semiconductor substrate 1S, and a silicon layer is formed over the embedded insulating layer BOX. The SOI substrate is formed from the semiconductor substrate 1S, the embedded insulating layer BOX, and the silicon layer. Then, the high voltage MISFET $Q_H$ is formed over this SOI substrate. A body region BD2 is formed in the silicon layer of the SOI substrate. The body region BD2 is formed, for example, from a p-type semiconductor region into which boron that is a p-type impurity is introduced. The gate insulating film GOX2 is formed over the body region BD2, and the gate electrode G is formed over the gate insulating film GOX2. The gate insulating film GOX2 is formed from a silicon oxide film, for example, and is thicker than the gate insulating film GOX1 of the low voltage MISFET $Q_N$. On the other hand, the gate electrode G is formed from a laminated film of the polysilicon film PF and the cobalt silicide film SL. The cobalt silicide film SL constituting a part of the gate electrode G is formed for reducing the resistance of the gate electrode G.

Subsequently, the sidewall SW is formed in a side wall on both sides of the gate electrode G, and low concentration impurity diffusion regions EX5s, EX5d are formed in the silicon layer that is a lower layer of the sidewall SW. These low concentration impurity diffusion regions EX5s, EX5d are formed in alignment with the gate electrode G. Then, a high concentration impurity diffusion region NR5s is formed on the outer side of the low concentration impurity diffusion region EX5s, and a high concentration impurity diffusion region NR5d is formed on the outer side of the low concentration impurity diffusion region EX5d. The high concentration impurity diffusion regions NR5s, NR5d are formed in alignment with the sidewall SW. Furthermore, the cobalt silicide film SL is formed in the surfaces of the high concentration impurity diffusion regions NR5s, NR5d. The source region SR is formed from the low concentration impurity diffusion region EX5s, the high concentration impurity diffusion region NR5s, and the cobalt silicide film SL, while the drain region DR is formed from the low concentration impurity diffusion region EX5d, the high concentration impurity diffusion region NR5d, and the cobalt silicide film SL.

The low concentration impurity diffusion regions EX5s, EX5d and the high concentration impurity diffusion regions NR5s, NR5d are semiconductor regions into which an n-type impurity, such as phosphorus or arsenic, is introduced, and the concentration of the impurity introduced into the low concentration impurity diffusion regions EX5s, EX5d is lower than the concentration of the impurity introduced into the high concentration impurity diffusion regions NR5s, NR5d.

The high voltage MISFET $Q_H$ in the third embodiment is characterized in that the body region BD2 is partially depleted. That is, during operation of the low voltage MISFET $Q_N$, the body region BD2 is partially depleted due to a work function value of the gate electrode G and a voltage value applied to the gate electrode. Such a partially depleted state of the body region BD1 can be realized by setting the impurity concentration of the body region BD2 high. Specifically, in the third embodiment, the impurity concentration of the body region BD2 is set to approximately $5 \times 10^{17}$ cm$^{-3}$. That is, in the third embodiment, the impurity concentration of the body region BD2 of the high voltage MISFET $Q_H$ is higher than the impurity concentration of the body region BD1 of the low voltage MISFET $Q_N$. By setting the impurity concentration of the body region BD2 high, the body region BD2 can be partially depleted without being fully depleted. By configuring the high voltage MISFET $Q_H$ from the partially-depleted FET in this manner, the breakdown voltage of the high voltage MISFET $Q_H$ (breakdown voltage between the source region SR and the drain region DR) can be improved. For example, in the partially-depleted FET, the impurity concentration of the body region BD2 is high. Therefore, although a depletion layer is formed in the boundary between the drain region DR and the body region BD2 when a voltage is applied between the source region SR and the drain region DR, the widening of this depletion layer to the body region BD2 is suppressed. That is, since the impurity concentration of the body region BD2 is high, the extension of the depletion layer to the body region BD2 is suppressed. Therefore, even if a higher voltage is applied, it is possible to suppress the depletion layer from extending through the body region BD2 and reaching the source region SR. That is, by configuring the high voltage MISFET $Q_H$ from the partially-depleted FET as with the third embodiment, the breakdown voltage can be increased. Specifically, the breakdown voltage of approximately 6 V can be secured by configuring the high voltage MISFET $Q_H$ from the partially-depleted FET.

The high voltage MISFET $Q_H$ in the third embodiment is configured as described above, and now the wiring structure formed over the high voltage MISFET $Q_H$ is described. In FIG. 22, the interlayer insulating film IL is formed so as to cover the high voltage MISFET $Q_H$ in the third embodiment. The interlayer insulating film IL is formed from a silicon oxide film, for example. Then, the contact hole CNT reaching the source region SR and the contact hole CNT reaching the drain region DR are formed in the interlayer insulating film IL. Then, a titanium/titanium nitride film and a tungsten film are embedded into the contact holes CNT to form the plugs PLG1, PLG2. The wiring L1 is formed over the interlayer insulating film IL in which the plug PLG1 and the plug PLG2 are formed. For example, the wiring L1 is formed from a laminated film of a titanium/titanium nitride film, an aluminum film, and a titanium/titanium nitride film. Furthermore, a multilayer wiring is formed over the wiring L1, but this is omitted in FIG. 22.

In this manner, the low voltage MISFET $Q_N$ and the high voltage MISFET $Q_H$ in the third embodiment can be formed. The low voltage MISFET $Q_N$ (fully-depleted FET) in the third embodiment is applied to the TX series transistor SE (TX), the RX series transistor SE (RX), and the RX shunt transistor SH (RX), while the high voltage MISFET $Q_H$ (partially-depleted FET) in the third embodiment is applied to the TX shunt transistor SH (TX). As a result, the number of serial connections of the TX shunt transistor SH (TX) can be reduced, and an antenna switch having low loss and low harmonic distortion can be realized. Specifically, for example, as compared with the comparative example (configuration of using the low voltage MISFET in the TX shunt transistor SH (TX)), the second harmonic distortion and the third harmonic distortion at the frequency of 0.9 GHz and the input power of 35 dB can be reduced by 5 dB, respectively, in the third embodiment.

Fourth Embodiment

Figure 23:
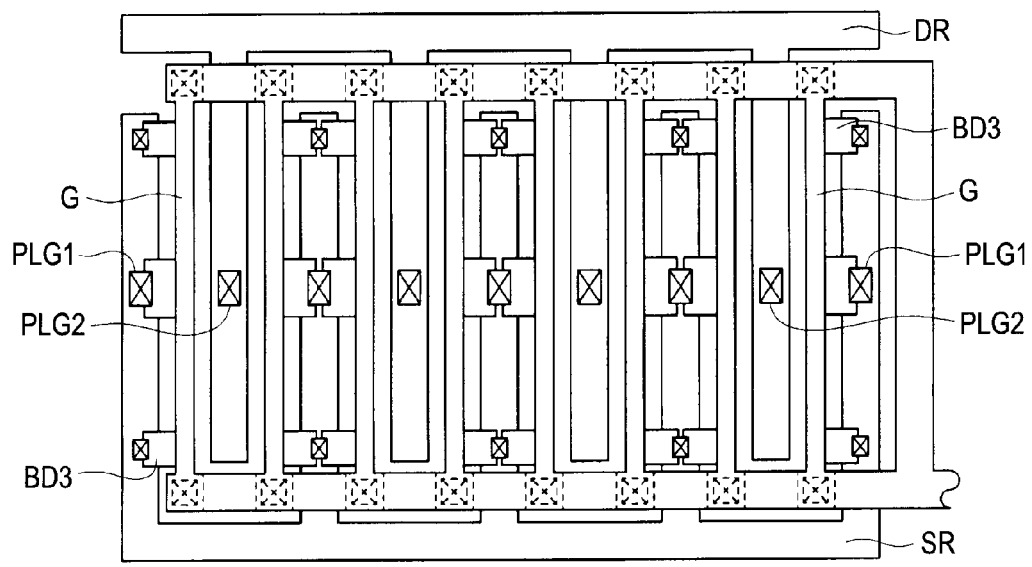
FIG. 23 is a plan view showing a device configuration of a high voltage MISFET constituting an antenna switch in a fourth embodiment.

In a fourth embodiment of the present invention, a device structure of another aspect of the high voltage MISFET $Q_H$ will be described. FIG. 23 shows a planar structure of the high voltage MISFET in the fourth embodiment. In FIG. 23, the high voltage MISFET has the source region SR and the drain region DR, and here the source region SR and the drain region DR are alternately positioned. Then, the gate electrode G is formed between the source region SR and the drain region DR. The plug PLG1 is coupled to the source region SR, and the plug PLG2 is coupled to the drain region DR. Here, the high voltage MISFET in the fourth embodiment is characterized in that a body region BD3 is also electrically coupled to the plug PLG1 that is electrically coupled to the source region SR. That is, the high voltage MISFET Q in the fourth embodiment is characterized in that the source region SR and the body region BD3 are electrically shorted. On the other hand, in the low voltage MISFET in the fourth embodiment, the source region and the body region are not electrically coupled to each other and the body region is in a floating state.

Figure 24:
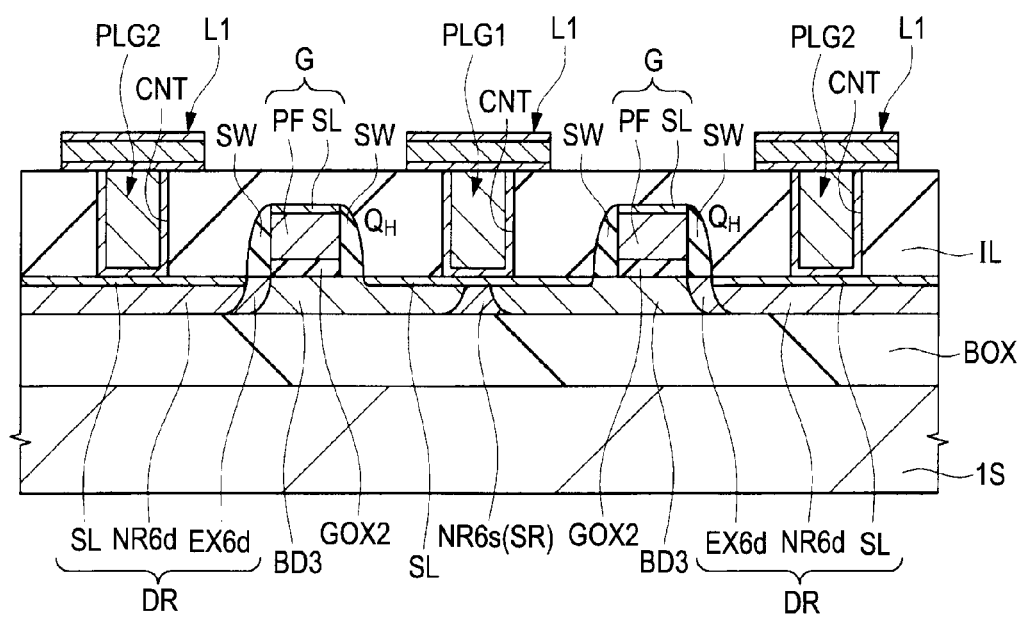
FIG. 24 is a cross sectional view showing a device structure of the high voltage MISFET constituting the antenna switch in the fourth embodiment.

FIG. 24 is a cross sectional view showing the cross section of the high voltage MISFET $Q_H$. In FIG. 24, the embedded insulating layer BOX is formed over the semiconductor substrate 1S, and a silicon layer is formed over the embedded insulating layer BOX. The SOI substrate is formed from the semiconductor substrate 1S, the embedded insulating layer BOX, and the silicon layer. Then, the high voltage MISFET $Q_H$ is formed over this SOI substrate. The body region BD3 is formed in the silicon layer of the SOI substrate. The body region BD3 is formed, for example, from a p-type semiconductor region into which boron that is a p-type impurity is introduced. The gate insulating film GOX2 is formed over the body region BD3, and the gate electrode G is formed over the gate insulating film GOX2. The gate insulating film GOX2 is formed from a silicon oxide film, for example, and is thicker than the gate insulating film GOX1 of the low voltage MISFET $Q_N$. On the other hand, the gate electrode G is formed from a laminated film of the polysilicon film PF and the cobalt silicide film SL. The cobalt silicide film SL constituting a part of the gate electrode G is formed for reducing the resistance of the gate electrode G.

Subsequently, the sidewall SW is formed in a side wall on both sides of the gate electrode G, and a low concentration impurity diffusion region EX6d is formed in the silicon layer that is a lower layer of the sidewall SW. The low concentration impurity diffusion region EX6d is formed in alignment with the gate electrode G. Then, a high concentration impurity diffusion region NR6d is formed on the outer side of the low concentration impurity diffusion region EX6d. The high concentration impurity diffusion region NR6d is formed in alignment with the sidewall SW. Furthermore, the cobalt silicide film SL is formed in the surface of the high concentration impurity diffusion region NR6d. The drain region DR is formed from the low concentration impurity diffusion region EX6d, the high concentration impurity diffusion region NR6d, and the cobalt silicide film SL.

In the fourth embodiment, although there is formed the drain region DR as described above, the source region is not symmetrical to the drain region. That is, in the high voltage MISFET $Q_H$ in the fourth embodiment, the body region BD3 formed in the lower layer of the gate electrode G extends to the source region SR side. Namely, the body region BD3 extends from directly under the gate electrode G and the sidewall SW on the source region SR side of FIG. 24 so as to abut the plug PLG1. Then, the source region SR (high concentration impurity diffusion region NR6s) is formed directly under the plug PLG1. Thereby, the body region BD3 and the source region SR will be electrically coupled to each other via the plug PLG1.

The high voltage MISFET $Q_H$ in the fourth embodiment is characterized in that the body region BD3 and the source region SR are electrically coupled to each other via the plug PLG1. Thereby, the breakdown voltage of the high voltage MISFET $Q_H$ in the fourth embodiment can be improved. This reason will be described below.

In the high voltage MISFET $Q_H$, applying a voltage between the drain region DR and the source region SR will generate a depletion layer in the boundary between the drain region DR and the body region BD. Since a high electric field is generated in this depletion layer, an electron is accelerated by this high electric field and collides with a silicon atom, and from the collided silicon atom, a hole and an electron are generated in a pair by impact ionization. The generated electron will move to the drain region DR side due to charges in the depletion layer. On the other hand, the hole is accelerated by the electric field in the depletion layer, and moves to the body region BD3. At this time, if the body region BD3 is in a floating state, the hole having flown into the body region BD3 is accumulated within the body region BD3. Then, the breakdown of the MISFET is likely to occur due to the effect of the accumulated hole. Then, in the fourth embodiment, the body region BD3 and the source region SR are electrically coupled to each other. Thus, the hole generated by impact ionization moves to the body region BD3, however, since the body region BD3 and the source region SR are electrically coupled to each other, the hole having moved to the body region BD3 will move to the source region SR without being accumulated in the body region BD3. As a result, it is possible to prevent the hole from being accumulated in the body region BD3. Accordingly, with the high voltage MISFET $Q_H$ in the fourth embodiment, the breakdown is unlikely to occur and the breakdown voltage can be improved because the hole is unlikely to be accumulated in the body region BD3. From the above, according to the fourth embodiment, the high voltage MISFET $Q_H$ having an improved breakdown voltage of approximately 6 V can be obtained.

The high voltage MISFET $Q_H$ in the fourth embodiment is configured as described above, and now the wiring structure formed over the high voltage MISFET $Q_H$ is described. In FIG. 24, the interlayer insulating film IL is formed so as to cover the high voltage MISFET $Q_H$ in the fourth embodiment. The interlayer insulating film IL is formed from a silicon oxide film, for example. Then, the contact hole CNT reaching the source region SR and the contact hole CNT reaching the drain region DR are formed in the interlayer insulating film IL. Then, a titanium/titanium nitride film and a tungsten film are embedded into the contact holes CNT to form the plugs PLG1, PLG2. The wiring L1 is formed over the interlayer insulating film IL in which the plug PLG1 and the plug PLG2 are formed. For example, the wiring L1 is formed from a laminated film of a titanium/titanium nitride film, an aluminum film, and a titanium/titanium nitride film. Furthermore, a multilayer wiring is formed over the wiring L1, but this is omitted in FIG. 24.

In this manner, the high voltage MISFET $Q_H$ in the fourth embodiment can be formed. The low voltage MISFET is applied to the TX series transistor SE (TX), the RX series transistor SE (RX), and the RX shunt transistor SH (RX), while the high voltage MISFET $Q_H$ in the fourth embodiment is applied to the TX shunt transistor SH (TX). As a result, the number of serial connections of the TX shunt transistor SH (TX) can be reduced, and an antenna switch having low loss and low harmonic distortion can be realized. Specifically, for example, as compared with the comparative example (configuration of using the low voltage MISFET in the TX shunt transistor SH (TX)), the second harmonic distortion and the third harmonic distortion at the frequency of 0.9 GHz and the input power of 35 dB can be reduced by 5 dB, respectively, in the fourth embodiment.

The present invention of the present inventor is described specifically as above based on the embodiments, however, it is obvious that the present invention is not limited to the embodiments and various modifications are possible within a range not departing from the gist of the invention.

In the above-described embodiments, an example has been described, in which the low voltage MISFET and the high voltage MISFET include field effect transistors formed over the SOI substrate, however, for example, the present invention can be also applied to a case where the low voltage MISFET and the high voltage MISFET include field effect transistors formed over a compound semiconductor substrate. A semi-insulating substrate is used in the compound semiconductor substrate. The semi-insulating substrate is a substrate including a GaAs substrate that is a compound semiconductor, as shown below. That is, in the compound semiconductor with a large forbidden band width, if a certain type of impurity is added, a deep level is formed within the forbidden band. Then, electrons and holes at this deep level are fixed, and the electron density of the conduction band or the hole density of the valence band becomes very low, and this compound semiconductor becomes like an insulator. Such a substrate is referred to as the semi-insulating substrate. In the GaAs substrate, the deep level is formed by adding Cr, In, oxygen, or the like or by introducing arsenic in excess, and the GaAs substrate becomes a semi-insulating substrate. With this semi-insulating substrate, the parasitic capacitance to GND can be reduced. However, even in this case, the TX shunt transistor includes high voltage MISFETs and the number of serial connections of the MISFETs constituting the TX shunt transistor is reduced, whereby the nonuniformity of the voltage amplitude applied to each of the MISFETs coupled in series is suppressed and thus further generation of high-order harmonics can be suppressed.

Furthermore, the above-described embodiments have been described with field effect transistors taken as an example, however, the technical idea of the present invention can be also applied to a case where a junction FET (JFET), an HEMT, or a bipolar transistor is used.

Note that, in the above-described embodiments, the devices having a single gate structure have been described, however, for example, the technical idea of the present invention can be also applied to devices having a multigate structures, such as a dual gate structure.

The present invention can be utilized widely in the industries for manufacturing semiconductor devices.

What is claimed is:

1. A semiconductor device comprising an antenna switch having a transmission terminal, an antenna terminal, and a reception terminal, the antenna switch including:
    (a) a plurality of first MISFETs coupled in series between the transmission terminal and the antenna terminal;
    (b) a plurality of second MISFETs coupled in series between the reception terminal and the antenna terminal;
    (c) a plurality of third MISFETs coupled in series between the transmission terminal and a GND terminal; and
    (d) a fourth MISFET coupled between the reception terminal and the GND terminal,
    wherein a gate insulating film of each of the first MISFETs, the second MISFETs, and the fourth MISFETs is thicker than that of each of the third MISFETs, and
    wherein a number of the third MISFETs coupled in series between the transmission terminal and the GND terminal is fewer than a number of the second MISFETs coupled in series between the reception terminal and the antenna terminal.

2. The semiconductor device according to claim 1,
    wherein the number of the third MISFETs coupled in series between the transmission terminal and the GND terminal is fewer than a number of the first MISFETs coupled in series between the transmission terminal and the antenna terminal.

3. The semiconductor device according to claim 1,
    wherein the number of the second MISFETs coupled in series between the reception terminal and the antenna terminal is the same as the number of the first MISFETs coupled in series between the transmission terminal and the antenna terminal.

4. The semiconductor device according to claim 1,
    wherein when a transmission signal is transmitted, the antenna switch electrically couples the transmission terminal and the antenna terminal to each other and also electrically isolates the reception terminal and the antenna terminal from each other.

5. The semiconductor device according to claim 4,
    wherein when the transmission signal is transmitted, the transmission terminal and the antenna terminal are electrically coupled to each other by turning on the first MISFETs, and also the reception terminal and the antenna terminal are electrically isolated from each other by turning off the second MISFETs.

6. The semiconductor device according to claim 5,
    wherein furthermore, when the transmission signal is transmitted, the transmission terminal and the GND terminal are electrically isolated from each other by turning off the third MISFETs, and also the reception terminal and the GND terminal are electrically coupled to each other by turning on the fourth MISFET.

7. The semiconductor device according to claim 1,
    wherein when a reception signal is received, the antenna switch electrically isolates the transmission terminal and the antenna terminal from each other and also electrically couples the reception terminal and the antenna terminal to each other.

8. The semiconductor device according to claim 7,
    wherein when the reception signal is received, the transmission terminal and the antenna terminal are electrically isolated from each other by turning off the first MISFETs, and also the reception terminal and the antenna terminal are electrically coupled to each other by turning on the second MISFETs.

9. The semiconductor device according to claim 8,
    wherein furthermore, when the reception signal is received, the transmission terminal and the GND terminal are electrically coupled to each other by turning on the third MISFETs, and also the reception terminal and the GND terminal are electrically isolated from each other by turning off the fourth MISFET.

10. The semiconductor device according to claim 1,
    wherein the transmission terminal of the antenna switch is electrically coupled to an output of a power amplifier for amplifying a transmission signal.

11. The semiconductor device according to claim 10,
    wherein the antenna terminal of the antenna switch is electrically coupled to an antenna.

12. The semiconductor device according to claim 11,
    wherein the reception terminal of the antenna switch is electrically coupled to an input of a reception circuit for processing a reception signal.

13. The semiconductor device according to claim 1,
    wherein the antenna switch is comprised of single semiconductor chip.

14. The semiconductor device according to claim 13,
    wherein the semiconductor chip is comprised of an SOI substrate including a semiconductor substrate, an embedded insulating layer formed over the semiconductor substrate, and a silicon layer formed over the embedded insulating layer.

15. The semiconductor device according to claim 14,
    wherein each of the first MISFETs, the second MISFETs and the fourth MISFET is comprised of a low voltage MISFET, and each of the third MISFETs is comprised of a high voltage MISFET,
    wherein the low voltage MISFET and the high voltage MISFET are formed over the SOI substrate;
    wherein the low voltage MISFET includes:
    (e1) a first gate insulating film formed over the silicon layer of the SOI substrate;
    (e2) a first gate electrode formed over the first gate insulating film;
    (e3) a first sidewall formed in a sidewall of the first gate electrode;
    (e4) a first source region formed in alignment with the first gate electrode in the silicon layer; and
    (e5) a first drain region formed in alignment with the first gate electrode in the silicon layer;
    wherein each of the first source region and the first drain region is formed from a first low concentration impurity diffusion region that is a semiconductor region formed by introducing a conductivity-type impurity into the silicon layer, the first low concentration impurity diffusion region being formed in alignment with the first gate electrode, and a first high concentration impurity diffusion region that is a semiconductor region formed by introducing a conductivity-type impurity into the silicon layer, the first high concentration impurity diffusion region having an impurity concentration higher than that of the first low concentration impurity diffusion region, and being formed on an outer side of the first low concentration impurity diffusion region;

wherein the high voltage MISFET includes:

(f1) a second gate insulating film formed over the silicon layer of the SOI substrate;

(f2) a second gate electrode formed over the second gate insulating film;

(f3) a second sidewall formed in a sidewall of the second gate electrode;

(f4) a second source region formed in alignment with the second gate electrode in the silicon layer; and (f5) a second drain region formed in alignment with the second gate electrode in the silicon layer; and wherein each of the second source region and the second drain region is formed from a second low concentration impurity diffusion region that is a semiconductor region formed by introducing a conductivity-type impurity into the silicon layer, the second low concentration impurity diffusion region being formed in alignment with the second gate electrode, and a second high concentration impurity diffusion region that is a semiconductor region formed by introducing a conductivity-type impurity into the silicon layer, the second high concentration impurity diffusion region having an impurity concentration higher than that of the second low concentration impurity diffusion region, and being formed on an outer side of the second low concentration impurity diffusion region.

16. The semiconductor device according to claim 15, wherein an impurity concentration of the second low concentration impurity diffusion region of the high voltage MISFET is lower than that of the first low concentration impurity diffusion region of the low voltage MISFET.

17. The semiconductor device according to claim 15, wherein a gate length of the second gate electrode of the high voltage MISFET is longer than that of the first gate electrode of the low voltage MISFET.

18. The semiconductor device according to claim 15, wherein the low voltage MISFET is a fully-depleted MISFET whose first body region formed in the silicon layer between the first source region and the first drain region is fully depleted, and wherein the high voltage MISFET is a partially-depleted MISFET whose second body region formed in the silicon layer between the second source region and the second drain region is partially depleted.

19. The semiconductor device according to claim 18, wherein an impurity concentration of the second body region is higher than that of the first body region.

20. The semiconductor device according to claim 15, wherein in the low voltage MISFET, a first body region formed in the silicon layer between the first source region and the first drain region is in a floating state, and wherein in the high voltage MISFET, a second body region formed in the silicon layer between the second source region and the second drain region is electrically coupled to the second source region.

* * * * *